(12) United States Patent
Imai

(10) Patent No.: US 8,032,339 B2
(45) Date of Patent: Oct. 4, 2011

(54) ELEMENT GROUPING METHOD FOR FINITE ELEMENT METHOD ANALYSIS, AND COMPUTER-READABLE STORAGE MEDIUM

(75) Inventor: Kanako Imai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 430 days.

(21) Appl. No.: 12/232,315

(22) Filed: Sep. 15, 2008

(65) Prior Publication Data

US 2009/0132214 A1 May 21, 2009

(30) Foreign Application Priority Data

Nov. 15, 2007 (JP) ................................ 2007-296840

(51) Int. Cl.
*G06F 17/50* (2006.01)
*G06F 7/60* (2006.01)
*G06F 17/10* (2006.01)
*G06T 15/00* (2011.01)

(52) U.S. Cl. ................................ 703/1; 703/2; 345/419
(58) Field of Classification Search .................. 703/1, 2; 345/419
See application file for complete search history.

(56) References Cited

U.S. PATENT DOCUMENTS

| | | | | |
|---|---|---|---|---|
| 4,858,146 A | * | 8/1989 | Shebini | 703/1 |
| 5,671,167 A | * | 9/1997 | Ito et al. | 716/51 |
| 5,819,070 A | * | 10/1998 | Sasaki | 703/13 |
| 5,891,131 A | * | 4/1999 | Rajan et al. | 606/5 |
| 6,544,650 B2 | * | 4/2003 | Iwamoto | 428/413 |
| 2002/0065613 A1 | * | 5/2002 | Woods et al. | 702/42 |
| 2004/0148143 A1 | | 7/2004 | Deobald et al. | |
| 2006/0235660 A1 | | 10/2006 | Chi | |

FOREIGN PATENT DOCUMENTS

| | | |
|---|---|---|
| EP | 1 777 509 A | 4/2007 |
| EP | 1 818 872 A | 8/2007 |
| JP | 8-263697 | 10/1996 |
| JP | 9-6992 | 1/1997 |

OTHER PUBLICATIONS

Britto, Arul M., "PATRAN Beginner's Guide", Apr. 15, 2005.*
MeshCAST Manual, Version 2007.0, Jul. 2007, pp. 42, 242.*
Stefan V Steinbrener: "The European Patent Convention" Software Patents Worldwide, vol. 1, Nov. 2007, pp. 1-90 XP002506732.
European Search report issued on Dec. 24, 2008 in corresponding European Patent Application 08164186.2.

* cited by examiner

*Primary Examiner* — Jason Proctor
*Assistant Examiner* — Cedric D Johnson
(74) *Attorney, Agent, or Firm* — Staas & Halsey LLP

(57) ABSTRACT

An element grouping method for Finite Element Method (FEM) analysis is implemented in a computer to group elements forming an analyzing mode. The method automatically obtains nodes of specific elements having a common parameter from the elements forming the analyzing model which is an analyzing target, and automatically groups nodes having a referring number which is a predetermined value or less. The specific elements belonging to the grouped nodes are automatically grouped as edge elements. A check is made to determine whether or not all specific elements in an edge portion of the analyzing model are grouped as the edge elements. Specific elements, other than the specific elements in the edge portion which are grouped as the edge elements, are automatically grouped as the in-plane elements.

14 Claims, 26 Drawing Sheets

FIG.7

| ELEMENT GROUP NUMBER (EGID) | MATERIAL NUMBER | YOUNG'S MODULUS (ELAS) |
|---|---|---|
| EGID 1 | Mn 1 | Ym 1 |
| ⋮ | ⋮ | ⋮ |

FIG.8

MEM1

| ELEMENT GROUP NUMBER $EGID_{X1}$ | ... | ELEMENT GROUP NUMBER $EGID_{Xn}$ |
|---|---|---|

FIG.15

MEM5

| GLASS ELEMENT GROUP EG$_{X1}$ | GLASS ELEMENT GROUP EG$_{X2}$ | ... | GLASS ELEMENT GROUP EG$_{Xn}$ |
|---|---|---|---|
| ELEMENT NUMBER ELEM | ELEMENT NUMBER ELEM | ... | ELEMENT NUMBER ELEM |
|  |  |  |  |
| ⋮ |  |  |  |

MEM6

| 1 | 2 | 3 | 4 |
|---|---|---|---|
| NODE NUMBER NODE$_{z1}$ | X COORDINATE | Y COORDINATE | Z COORDINATE |
| ⋮ | | | |
| NODE$_{zP}$ | | | |

| NODE NUMBER | NODE NUMBER | ... | NODE NUMBER |
|---|---|---|---|

MEM8

FIG.29

MEM9

| GLASS ELEMENT GROUP NUMBER EGIDx1 | GLASS ELEMENT GROUP NUMBER EGIDx2 | ... | GLASS ELEMENT GROUP NUMBER EGIDxn |
|---|---|---|---|
| ELEMENT NUMBER | ELEMENT NUMBER | ... | ELEMENT NUMBER |
| ⋮ | ⋮ | | ⋮ |
| | | | |

ELEMENT GROUPING METHOD FOR FINITE ELEMENT METHOD ANALYSIS, AND COMPUTER-READABLE STORAGE MEDIUM

BACKGROUND OF THE INVENTION

1. Field of the Invention

The present invention generally relates to element grouping methods for the Finite Element Method (FEM) analysis and computer-readable storage media, and more particularly to an element grouping method for grouping elements such as glass, plastic and ceramic when carrying out the FEM analysis, and to a computer-readable storage medium which stores a program for causing a computer to execute such an element grouping method.

2. Description of the Related Art

For example, when designing an electronic apparatus by Computer Aided Design (CAD), the FEM analysis is used. An analyzing model that is created by the FEM analysis is subjected to various tests and evaluations. For example, the evaluation of the strength of the electronic apparatus is one of such evaluations.

When evaluating the strength of a housing of the electronic apparatus, for example, a break test is carried out with respect to each portion of the housing by simulation. In this case, it is necessary to judge whether or not a break occurs in the elements forming the analyzing model under predetermined conditions. When judging whether or not the break occurs in the elements made of a breakable material such as glass, plastic and ceramic, a threshold value that is used as a reference in judging the break takes a different value between an edge portion and a surface portion which is other than the edge portion. For this reason, glass elements, for example, need to be grouped into the edge elements forming the edge portion of the analyzing model, and in-plane elements forming the surface portion other than the edge portion of the analyzing model. The judgement to determine whether a break occurs is made separately with respect to the group of edge elements and the group of in-plane elements. In the case of the conventional CAD using the FEM analysis, a user manually groups the glass elements of the analyzing model into the edge elements and the in-plane elements, in order to evaluate the break in the portion of the analyzing model made of glass.

Because the conventional CAD using the FEM analysis requires the user to manually group the glass elements of the analyzing model into the edge elements and the in-plane elements, the grouping process is troublesome to perform and the load on the user is large. In addition, because the grouping process is performed manually by the user, an erroneous grouping process may be perform if the user makes an erroneous operation or makes an erroneous judgement. Furthermore, the user must manually perform a similar grouping process every time the analyzing element (or part size or element size) changes, and it is difficult to improve the efficiency of the grouping process.

Therefore, in the conventional CAD using the FEM analysis, there was a problem in that it is difficult to perform the grouping process, which groups the glass elements of the analyzing model into the edge elements and the in-plane elements, for example, by reducing the load on the user and efficiently and accurately performing the grouping process.

SUMMARY OF THE INVENTION

Accordingly, it is a general object of the present invention to provide a novel and useful element grouping methods for the FEM analysis and computer-readable storage medium, in which the problem described above is suppressed.

Another and more specific object of the present invention is to provide an element grouping method for the FEM analysis and a computer-readable storage medium, which enable a grouping process, which groups elements made of a breakable material and forming an analyzing model into edge elements and in-plane elements, to be performed efficiently and accurately while reducing the load on the user.

According to one aspect of the present invention, there is provided an element grouping method for Finite Element Method (FEM) analysis, to be implemented in a computer, comprising a node grouping step automatically obtaining, by the computer, nodes of specific elements having a common parameter from elements forming an analyzing model which is an analyzing target, and automatically grouping and storing in a storage part, by the computer, nodes having a referring number which is a predetermined value or less; an edge element grouping step obtaining, by the computer, the specific elements belonging to the grouped nodes from the storage part, and automatically grouping and storing in the storage part, by the computer, the specific elements that are obtained as edge elements; a grouping check step checking, by the computer, whether or not all specific elements in an edge portion of the analyzing model are grouped as the edge elements, and automatically executing the edge element grouping step by the computer until all specific elements in the edge portion are grouped as the edge elements; and an in-plane element grouping step automatically grouping and storing in the storage part, by the computer, specific elements, other than the specific elements in the edge portion which are grouped as the edge elements, as the in-plane elements. According to this aspect of the present invention, it is possible to perform the grouping process, which groups elements made of the breakable material and forming the analyzing model into the edge elements and the in-plane elements, efficiently and accurately while reducing the load on the user.

According to another aspect of the present invention, there is provided a computer-readable storage medium which stores a program for causing a computer to carry out an element grouping method for Finite Element Method (FEM) analysis, the program comprising a node grouping procedure automatically causing the computer to obtain nodes of specific elements having a common parameter from elements forming an analyzing model which is an analyzing target, and to automatically group and store in a storage part nodes having a referring number which is a predetermined value or less; an edge element grouping procedure causing the computer to obtain the specific elements belonging to the grouped nodes from the storage part, and to automatically group and store in the storage part the specific elements that are obtained as edge elements; a grouping check step procedure causing the computer to check whether or not all specific elements in an edge portion of the analyzing model are grouped as the edge elements, and to automatically execute the edge element grouping procedure until all specific elements in the edge portion are grouped as the edge elements; and an in-plane element grouping procedure causing the computer to automatically group and store in the storage part specific elements, other than the specific elements in the edge portion which are grouped as the edge elements, as the in-plane elements. According to this aspect of the present invention, it is possible to perform the grouping process, which groups elements made of the breakable material and forming the analyzing model into the edge elements and the in-plane elements, efficiently and accurately while reducing the load on the user.

Other objects and further features of the present invention will be apparent from the following detailed description when read in conjunction with the accompanying drawings.

BRIEF DESCRIPTION OF THE DRAWINGS

FIG. 7 is a diagram for explaining material data;

FIG. 8 is a diagram for explaining a glass element group number storage region;

FIG. 15 is a diagram for explaining an edge element storage region;

FIG. 29 is a diagram for explaining an in-plane element storage region;

DESCRIPTION OF THE PREFERRED EMBODIMENTS

Figure 1:
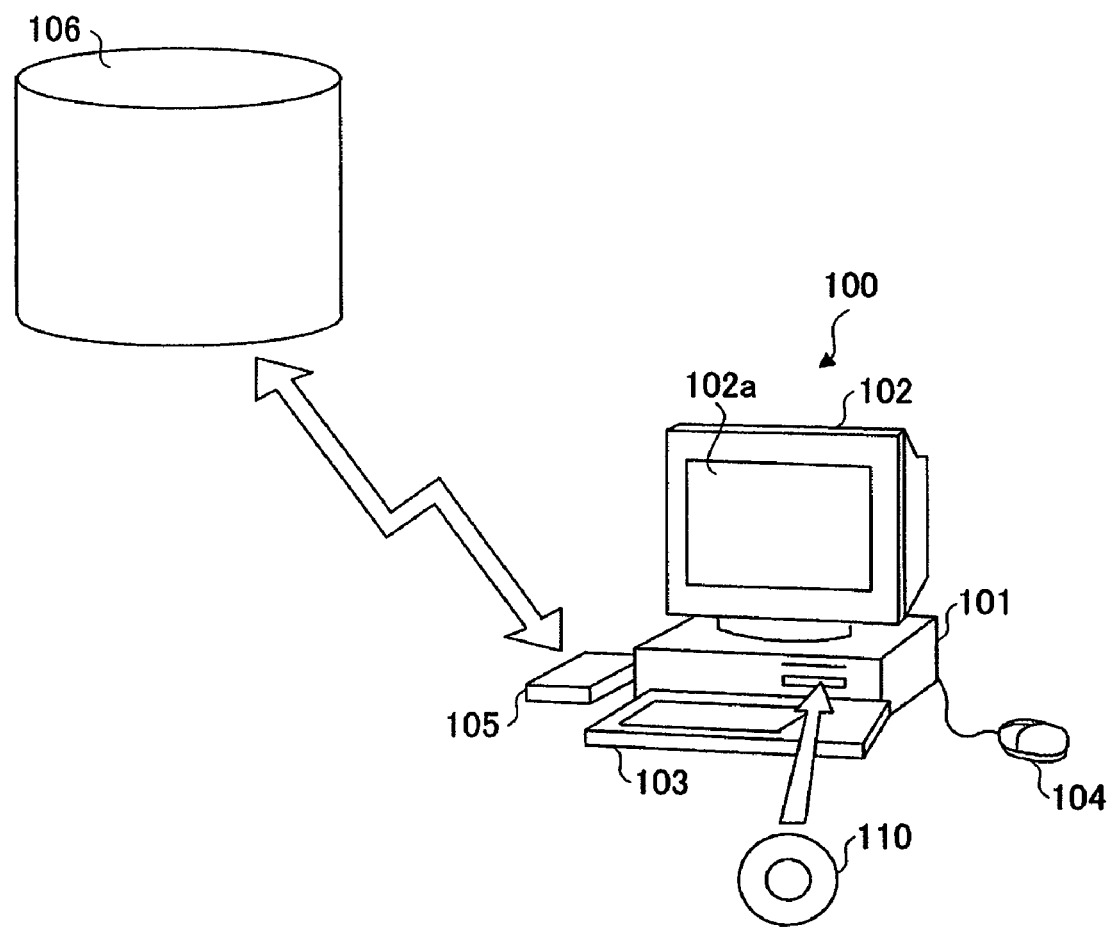
FIG. 1 is a perspective view illustrating a computer system to which an embodiment of the present invention may be applied.

In one embodiment of the present invention, in a CAD using the FEM analysis, elements forming an analyzing model which is the analyzing target are automatically grouped into edge elements and in-plane elements. For example, the elements that are automatically grouped are elements made of a breakable material, elements that are selected or, elements automatically extracted from the analyzing model. The elements that are automatically grouped have a specific parameter (for example, material) that is common to each of the elements.

A node grouping process obtains nodes of the elements of the analyzing model, and groups the nodes that are referred to by a number of times (hereinafter referred to as a node referring number) less than or equal to a predetermined value. An edge element grouping process groups the elements belonging to the grouped nodes as the edge elements. An edge element grouping check process checks whether or not all of the elements in an edge portion of the analyzing model are grouped as the edge elements, and carries out the edge element grouping process until all of the elements in the edge portion are grouped as the edge elements. An in-plane element grouping process groups the elements other than the elements in the edge portion that are grouped, that is, groups the elements other than the edge elements as the in-plane elements.

Accordingly, when grouping the edge elements, the node referring number is confirmed, and a check is made based on the node referring number whether or not the edge elements of the edge element group are continuous by a combination of the nodes of the edge elements and the edge elements, in order to automatically group the edge elements. In addition, the elements that are not in the edge element group are automatically grouped as the in-plane elements. Hence, the grouping process to group the elements into the edge elements and the in-plane elements can be performed efficiently and accurately, while reducing the load on the user.

A description will be given of embodiments of the element grouping method for the FEM analysis and the computer-readable storage medium according to the present invention, by referring to the drawings.

FIG. 1 is a perspective view illustrating a computer system to which an embodiment of the present invention may be applied. A computer system 100 illustrated in FIG. 1 includes a main body 101, a display 102, a keyboard 103, a mouse 104, and a modem 105. The main body 101 includes a CPU, a disk drive and the like. The display 102 displays an analysis model and the like on a display screen 102a in response to an instruction from the main body 101. The keyboard 103 is used to input various information to the computer system 100. The mouse 104 is used to specify an arbitrary position on the display screen 102a of the display 102. The modem 105 is used to make access to an external database and the like, and to download programs and the like stored in other computer systems.

A program (or grouping software or tool), which causes the computer system 100 to at least have a grouping function, is input to and compiled in the computer system 100. The grouping function groups elements of an analyzing model, which are made of a breakable material, into edge elements and in-plane elements. This program is stored in a portable recording medium such as a disk 110 or, is downloaded from a recording medium 106 of another computer system using a communication apparatus such as the modem 105. This program causes the computer system 100 (that is, a processor 201 which will be described later) to operate as a Computer Aided Design (CAD) apparatus (or simulation system) having the grouping function. This program may be stored in a computer-readable storage medium such as the disk 110. The computer-readable storage medium is not limited to portable recording media such as the disk 110, an Integrated Circuit (IC) card memory, a magnetic disk such as a floppy disk (registered trademark), a magneto-optical disk, a CD-ROM and the like, and includes various recording media capable of accessing a computer system that is connected to the computer system 100 via a communication means or communication apparatus such as the modem 105 and a Local Area Network (LAN).

Figure 2:
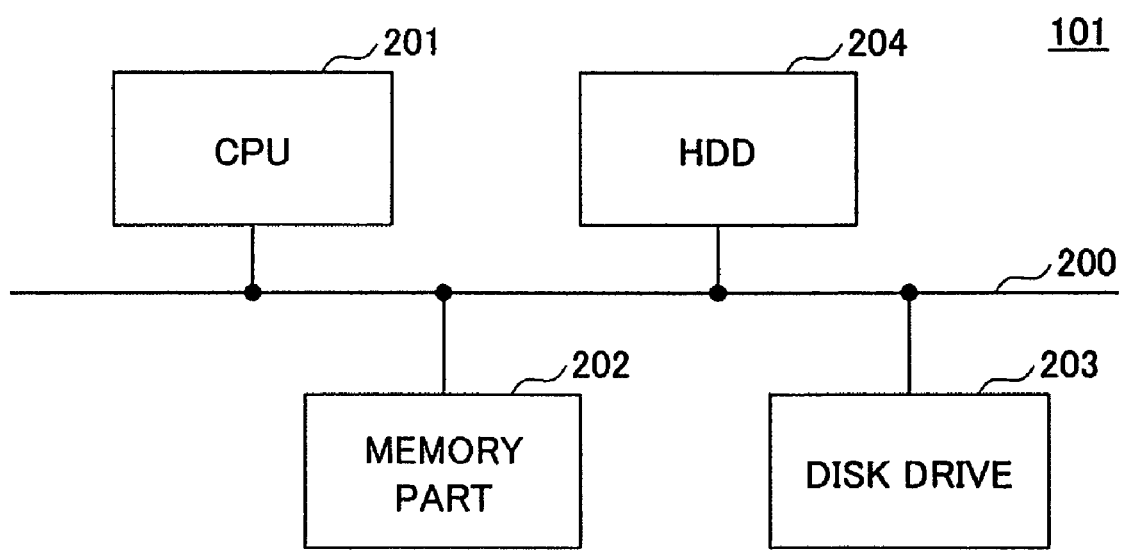
FIG. 2 is a system block diagram illustrating a structure of a part within a main body of a computer system illustrated in FIG. 1.

FIG. 2 is a system block diagram illustrating a structure of a part within the main body 101 of the computer system 100. In FIG. 2, the main body 101 includes a processor (CPU: Central Processing Unit) 201, a memory part 202 including a Random Access Memory (RAM), a Read Only Memory (ROM) and the like, a disk drive 203 for the disk 110, and a Hard Disk Drive (HDD) 204 which are connected via a bus 200. In this embodiment, the display 102, the keyboard 103 and the mouse 104 are also connected to the CPU 201 via the bus 200. However, any of the display 102, the keyboard 103 and the mouse 104 may be connected directly to the CPU 201. In addition, the display 102 may be connected to the CPU 201 via a known graphic interface (not shown) which processes input and output image data.

The structure of the computer system 100 is not limited to that illustrated in FIGS. 1 and 2, and various other known structures may be used instead.

Figure 3:
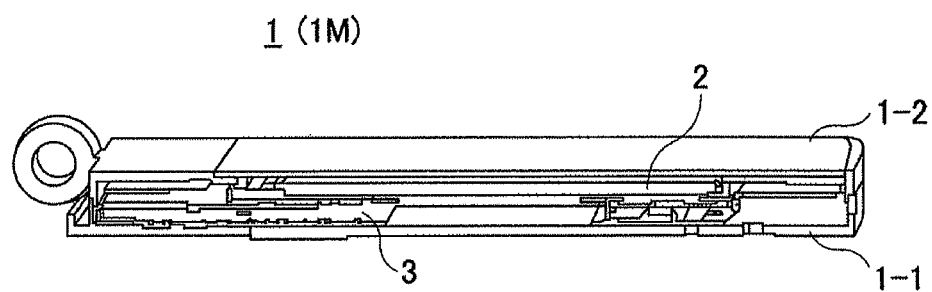
FIG. 3 is a side view illustrating an analyzing model.
Figure 4:
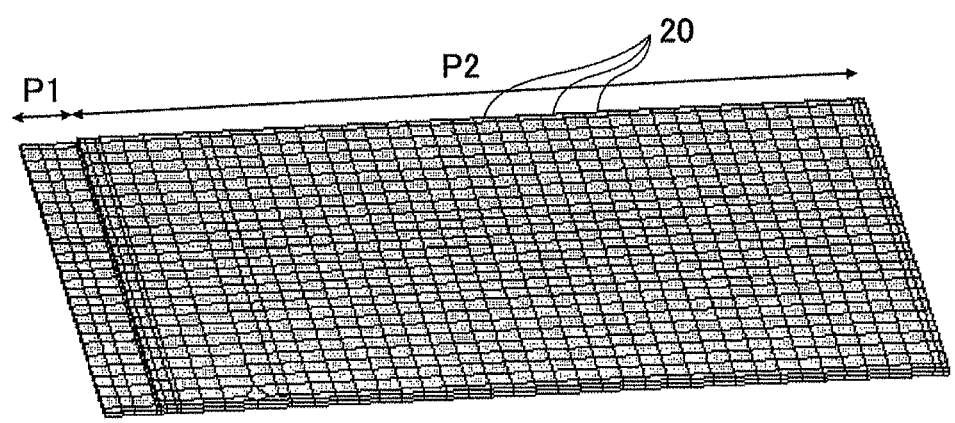
FIG. 4 is a perspective view illustrating elements which are made of a breakable material and is obtained from the analyzing model illustrated in FIG. 3.

First, a description will be given of a grouping process of this embodiment. FIG. 3 is a side view illustrating an analyzing model, and FIG. 4 is a perspective view illustrating elements which are made of a breakable material such as glass, plastic and ceramic, and is obtained from the analyzing model illustrated in FIG. 3. In this example, is assumed for the same of convenience that the analyzing model is a housing of a portable telephone, which has been segmented into elements, and that glass elements forming a display panel are obtained from the analyzing model.

A portable telephone 1 illustrated in FIG. 3 has a structure wherein a printed circuit board 3 and a display panel 2 are covered by housings 1-1 and 1-2. FIG. 4 illustrates glass elements 20 which form the display panel 2 and are obtained from an analyzing model 1M of the portable telephone 1. In this example, there is a step or, a height difference, between the glass elements 20 forming a portion P1 and the glass elements 20 forming a portion P2.

Figure 5:
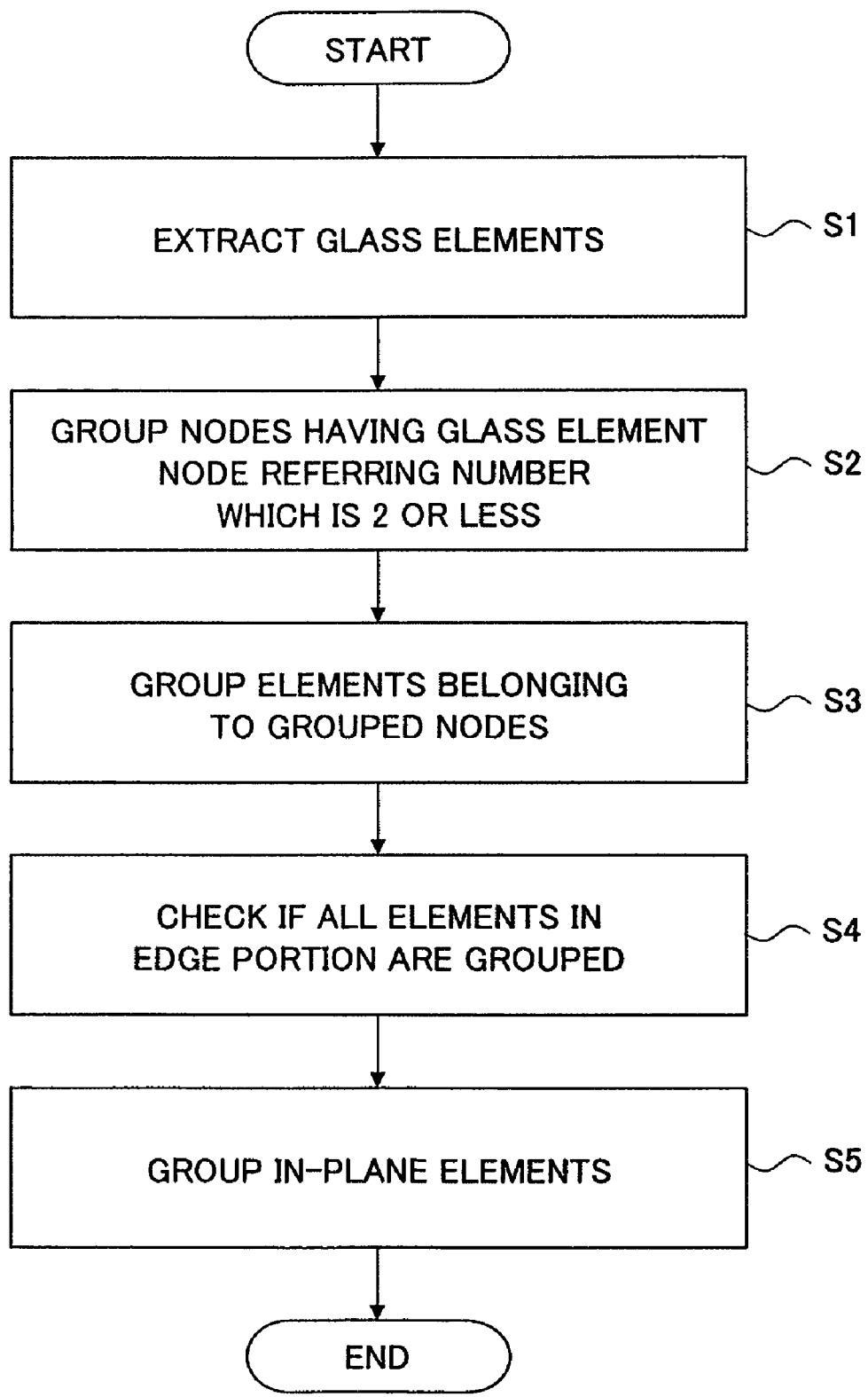
FIG. 5 is a flow chart for generally explaining the grouping process.

FIG. 5 is a flow chart for generally explaining the grouping process. The process illustrated in FIG. 5 is executed by the CPU 201. In FIG. 5, a step S1 carries out a glass element extracting process which extracts the glass elements from the analyzing model 1M illustrated in FIG. 3. A step S2 obtains nodes of the glass elements 20, and carries out a node grouping process which groups nodes having the node referring number which is 2 or less, for example. A step S3 carries out an edge element grouping process which groups the glass elements 20 belong to the nodes grouped in the step S2 as the edge elements. A step S4 checks whether or not all of the glass elements in the edge portion of the display panel 2 are grouped as the edge elements, and carries out an edge element grouping check process which carries out the grouping of the step S3 until all of the glass elements in the edge portion are grouped as the edge elements. A step S5 carries out an in-plane element grouping process which groups the elements other than the grouped glass elements 20 in the edge portion, that is, the glass elements 20 other than the edge elements, as the in-plane elements, and the process ends. The processes of the steps S1 through S5 are carried out automatically by the CPU 201, and the user does not need to manually perform the operation such as grouping. In addition, results of the processes of the steps S1 through S5 are displayed on the display screen 102a of the display 102 in the form of graphics and/or messages.

The glass element extracting process of the step S1, the node grouping process of the step S2, the edge element grouping process of the step S3, the edge element grouping check process of the step S4, and the in-plane element grouping process of the step S5 respectively correspond to procedures the program causes the computer to execute or, functions the program causes the computer to realize, in one embodiment of the present invention.

Figure 6:
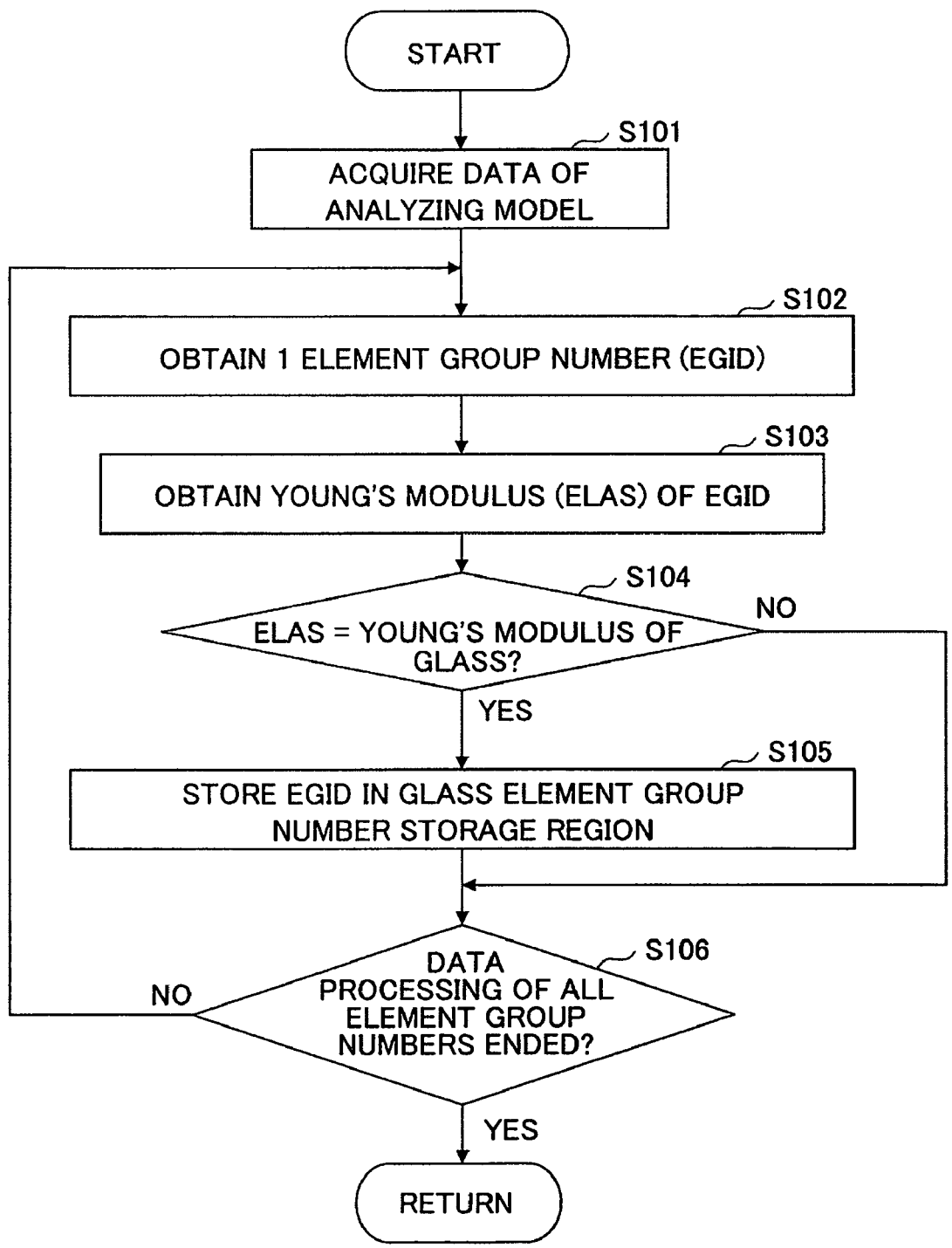
FIG. 6 is flow chart for explaining a glass element extracting process.

FIG. 6 is flow chart for explaining the glass element extracting process of the step S1. In FIG. 6, a step S101 acquires data of the analyzing model 1M which is specified by the user from the keyboard 103 or the like, from an external storage part such as the recording medium 106 or, an internal storage part such as the memory part 202, the disk drive 203 and the HDD 204. The acquired data of the analyzing model 1M include material data illustrated in FIG. 7. FIG. 7 is a diagram for explaining the material data. As illustrated in FIG. 7, with respect to each element group number to which each element forming the analyzing model 1M belongs, a material number indicating the material forming each element and the Young's modulus of the material forming each element are recorded as the material data. It is of course possible to record other parameters, such as the strength and/or the elasticity (or flexibility) of the material, in the material data in place of the Young's modulus.

A step S102 obtains one element group number EGID from the material data illustrated in FIG. 7, and a step S103 obtains the Young's modulus ELAS of the material forming the element having the element group number EGID obtained in the step S102. A step S104 decides whether or not the obtained Young's modulus ELAS matches the Young's modulus of glass. If the decision result in the step S104 is YES, a step S105 regards the element group number EGID of the element having the Young's modulus ELAS obtained in the step S103 as a glass element group number, and stores this glass element group number in a glass element group number storage region MEM1 illustrated in FIG. 8. After the step S106, the process advances to a step S106 which will be described later. FIG. 8 is a diagram for explaining the glass element group number storage region MEM1. The glass element group number storage region MEM1 is provided in the internal storage part, for example, and for example, stores element group numbers EGIDx1, ..., EGIDxn as the glass element group numbers. On the other hand, if the decision result in the step S104 is NO, the process advances directly to the step S106. The step S106 decides whether or not the processing of the data of all element group numbers EGID within the material data of the analyzing model 1M has ended, and the process returns to the step S102 if the decision result in the step S106 is NO. If the decision result in the step S106 is YES, the process ends and advances to the step S2 illustrated in FIG. 5.

Figure 9:
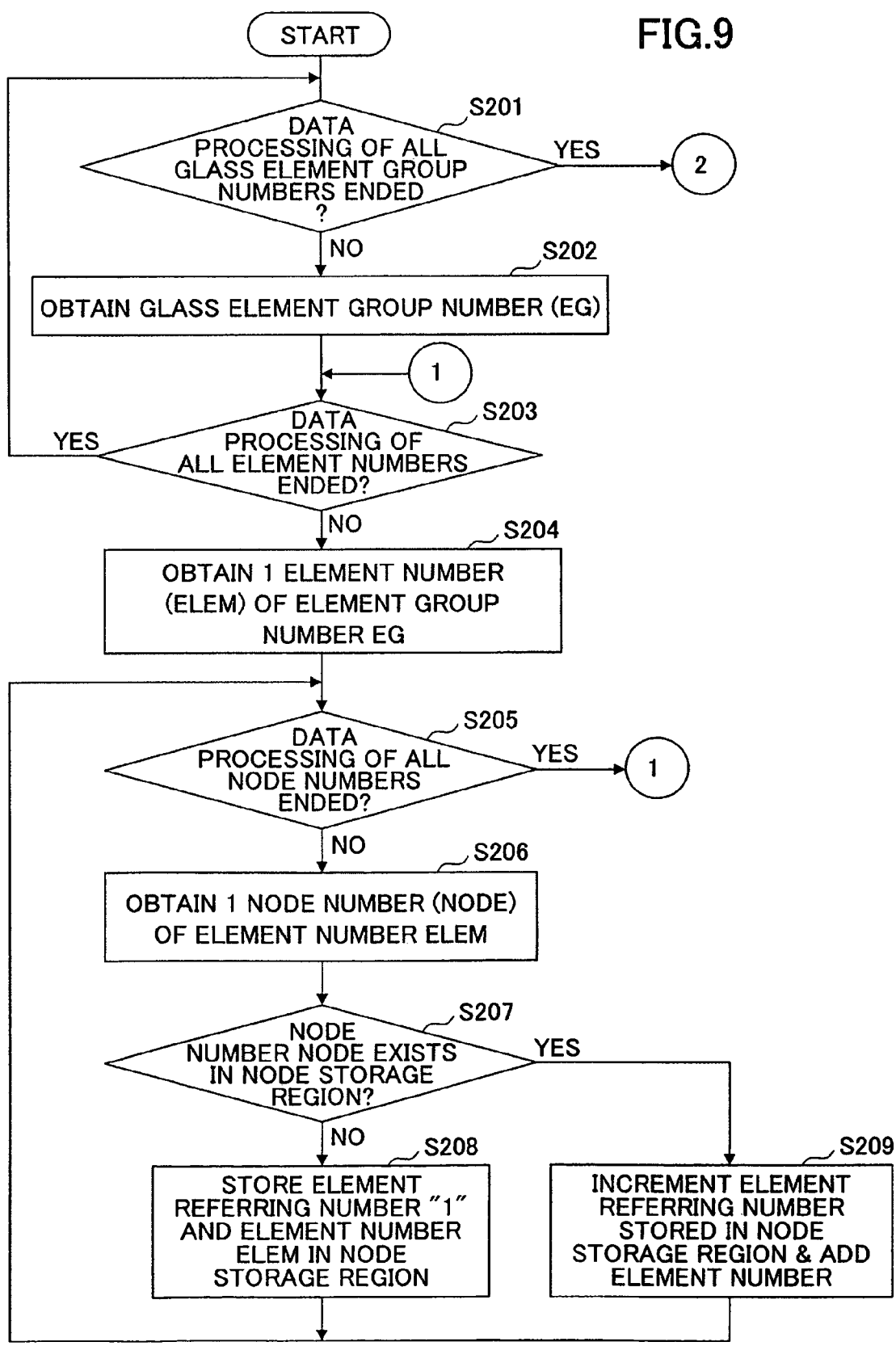
FIG. 9 is a flow chart for explaining a node grouping process.
Figure 10:
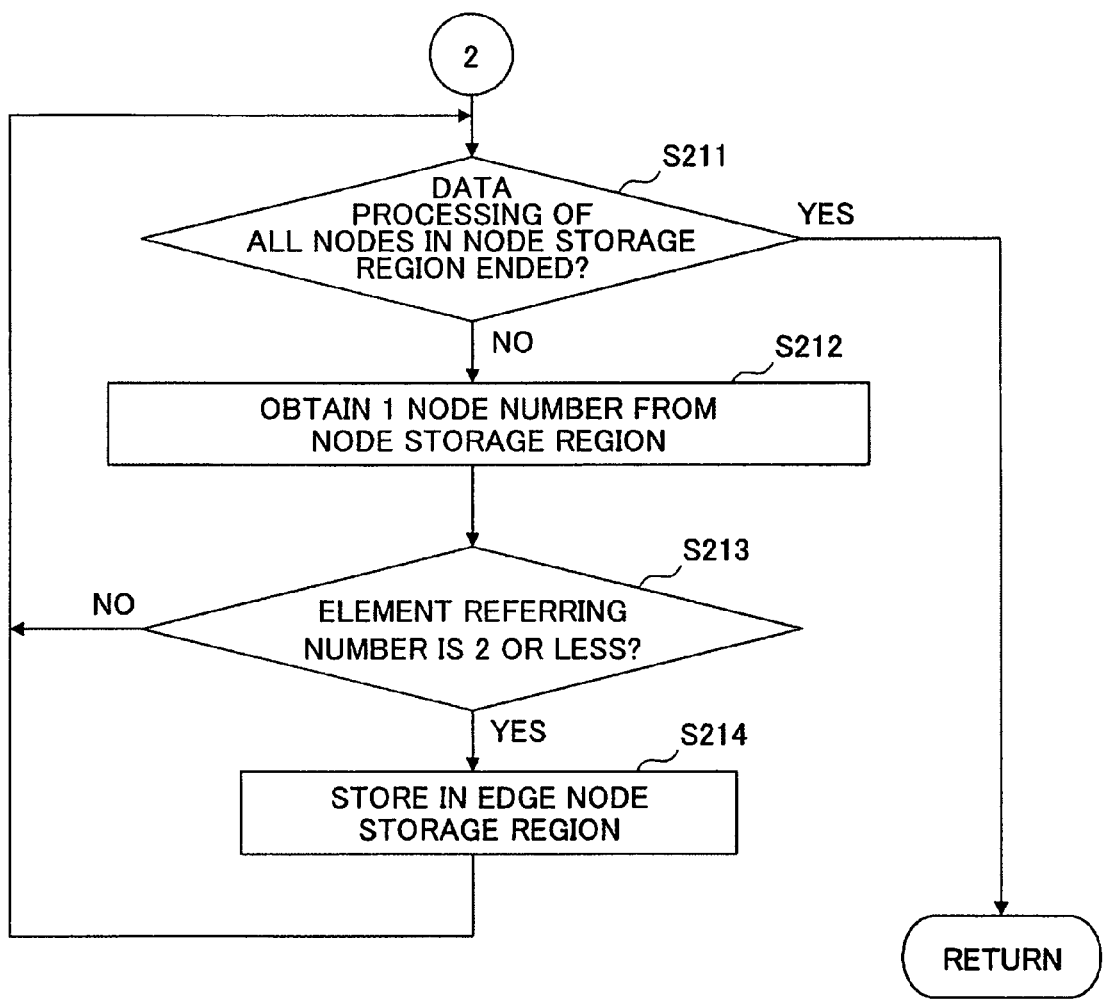
FIG. 10 is a flow chart for explaining the node grouping process.
Figure 11:
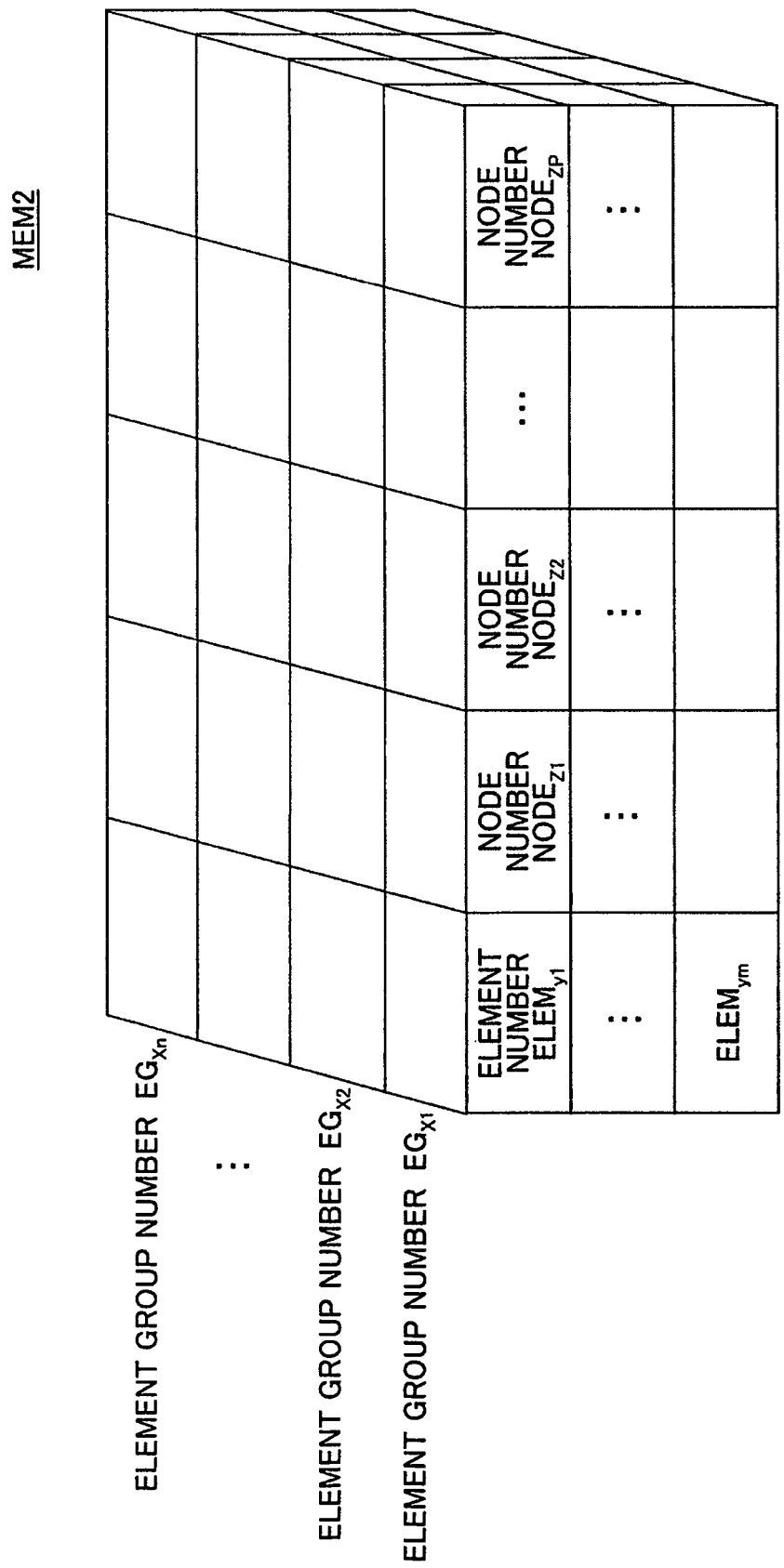
FIG. 11 is a diagram for explaining an element storage region.

FIGS. 9 and 10 are flow charts for explaining the node grouping process of the step S2. In FIG. 9, a step S201 decides whether or not the processing of the data of all glass element group numbers EGID stored in the glass element group number storage region MEM1 illustrated in FIG. 8 has ended, and the process advances to a step S211 described later in conjunction with FIG. 10 if the decision result in the step S201 is YES. On the other hand, if the decision result in the step S201 is NO, a step S202 obtains one glass element group number EG from the glass element group number storage region MEM1. A step S203 decides whether or not the processing of the data of all element numbers of the obtained glass element group number EG has ended, and the process returns to the step S201 if the decision result in the step S203 is YES. If the decision result in the step S203 is NO, a step S204 obtains one element number ELEM from the glass element group number EG which is obtained from an element storage region MEM2 illustrated in FIG. 11. FIG. 11 is a diagram for explaining the element storage region MEM2. The element storage region MEM2 is provided in the internal storage part, for example, and stores element numbers ELEMy1, ..., ELEMym of each of element group numbers EGx1, ..., EGxn and node numbers NODEz1, ..., NODEzp of each of the elements ELEMy1, ..., ELEMym, with respect to each of the element group numbers EGx1, ..., EGxn.

Figure 12:
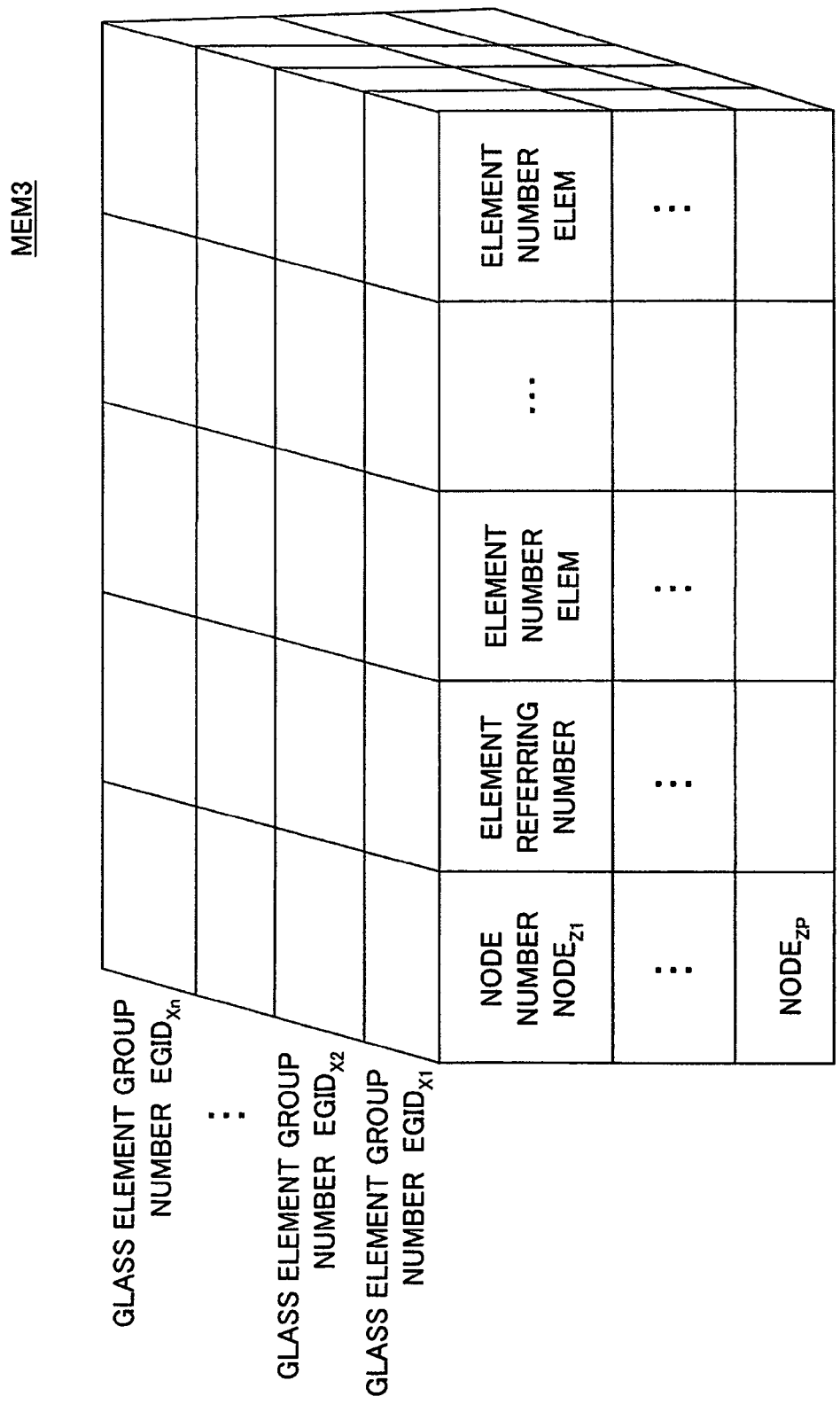
FIG. 12 is a diagram for explaining a node storage region.

A step S205 decides whether or not the processing of data of all node numbers of the element number ELEM obtained in the step S204 has ended, and the process returns to the step S203 if the decision result in the step S205 is YES. On the other hand, if the decision result in the step S205 is NO, a step S206 obtains one node number NODE of the element number ELEM from the element storage region MEM2. A step S207 decides whether or not the node number NODE obtained in the step S206 is stored in a node storage region MEM3 illustrated in FIG. 12. FIG. 12 is a diagram for explaining the node storage region MEM3. For example the node storage region MEM3 is provided in the internal storage part, and stores each of the node numbers NODEz1, ..., NODEzp, an element referring number RN and the element number ELEM, with respect to each of the glass element group numbers EGIDx1, ..., EGIDxn. If the decision result in the step S207 is NO, a step S208 stores the element referring number RN=1 and the element number ELEM in the node storage region MEM3, and the process returns to the step S205. On the other hand, if the decision result in the step S08 is YES, a step S209 increments the element referring number RN which is stored in the node storage region MEM3 by "+1", adds the element number ELEM in the node storage region MEM3, and the process returns to the step S205.

Figure 13:
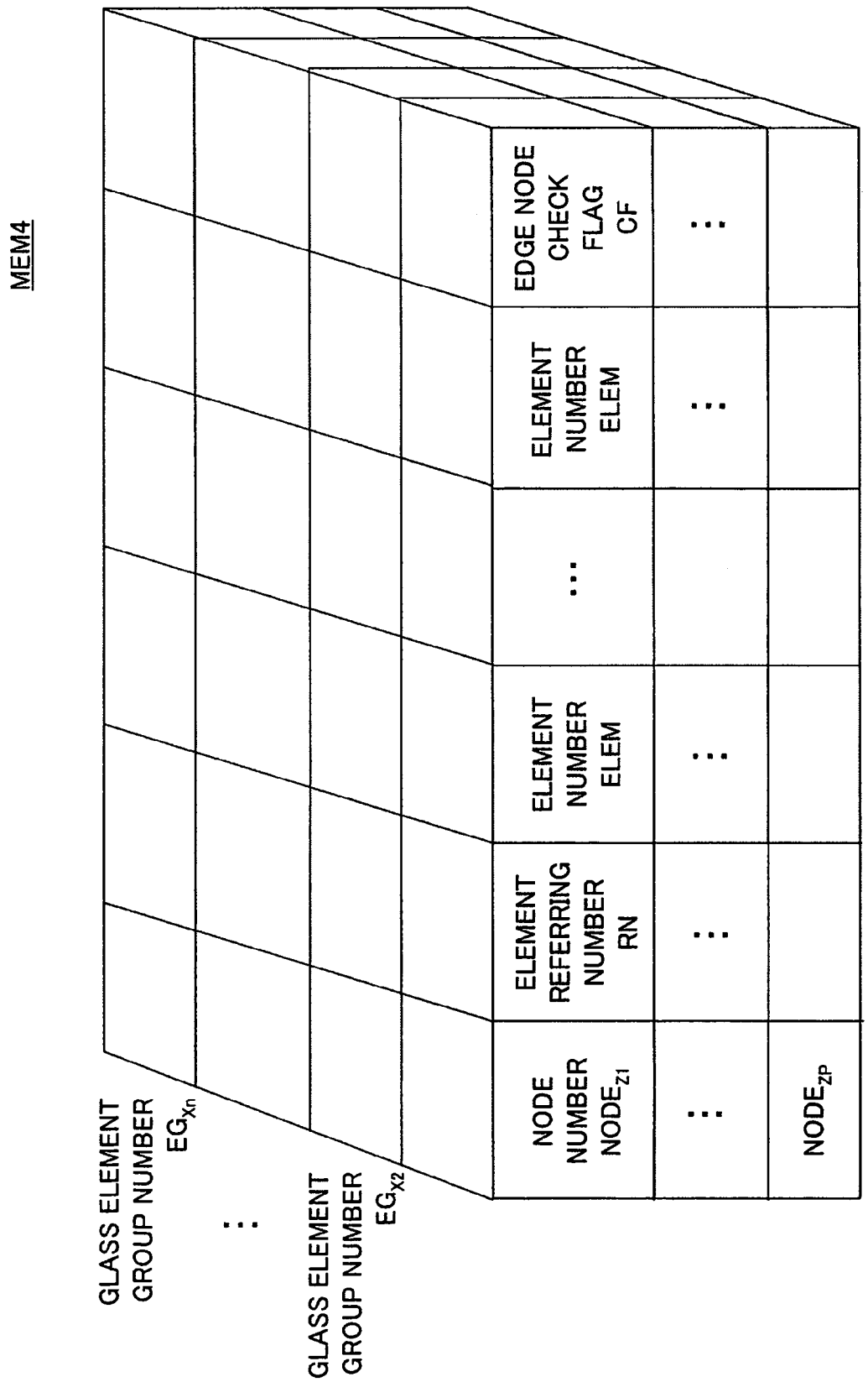
FIG. 13 is a diagram for explaining an edge node storage region.

In FIG. 10, the step S211 decides whether or not the processing of the data of all of the node numbers NODEz1, ..., NODEzp stored in the node storage region MEM3 has ended. If the decision result in the step S211 is NO, a step S212 obtains one node number NODE which is stored in the node storage region MEM3. A step S213 decides whether or not the element referring number RN of the node number NODE obtained in the step S212 is 2 or less, and the process returns to the step S211 if the decision result in the step S213 is NO. On the other hand, if the decision result in the step S213 is YES, a step S214 stores the data of the node number NODE having the element referring number RN which is 2 or less, in an edge node storage region MEM4 illustrated in FIG. 13. FIG. 13 is a diagram for explaining the edge node storage region MEM4. The edge node storage region MEM4 is provided in the internal storage part, for example, and the data stored in the edge node storage region MEM4 includes the glass element group numbers EGx1, ..., EGxn, the node numbers NODEz1, ..., NODEzp, the element referring number RN, the element number ELEM, and an edge node check flag CF, for example. The edge node check flag CF is used when checking the edge element, and is initially set to "0". If the decision result in the step S211 is YES, the process ends and advances to the step S3 illustrated in FIG. 5. Accordingly, it is possible to obtain the nodes of the glass elements from the glass element group that is extracted in the step S1, and to automatically group the nodes having the referring number which is 2 or less.

Figure 14:
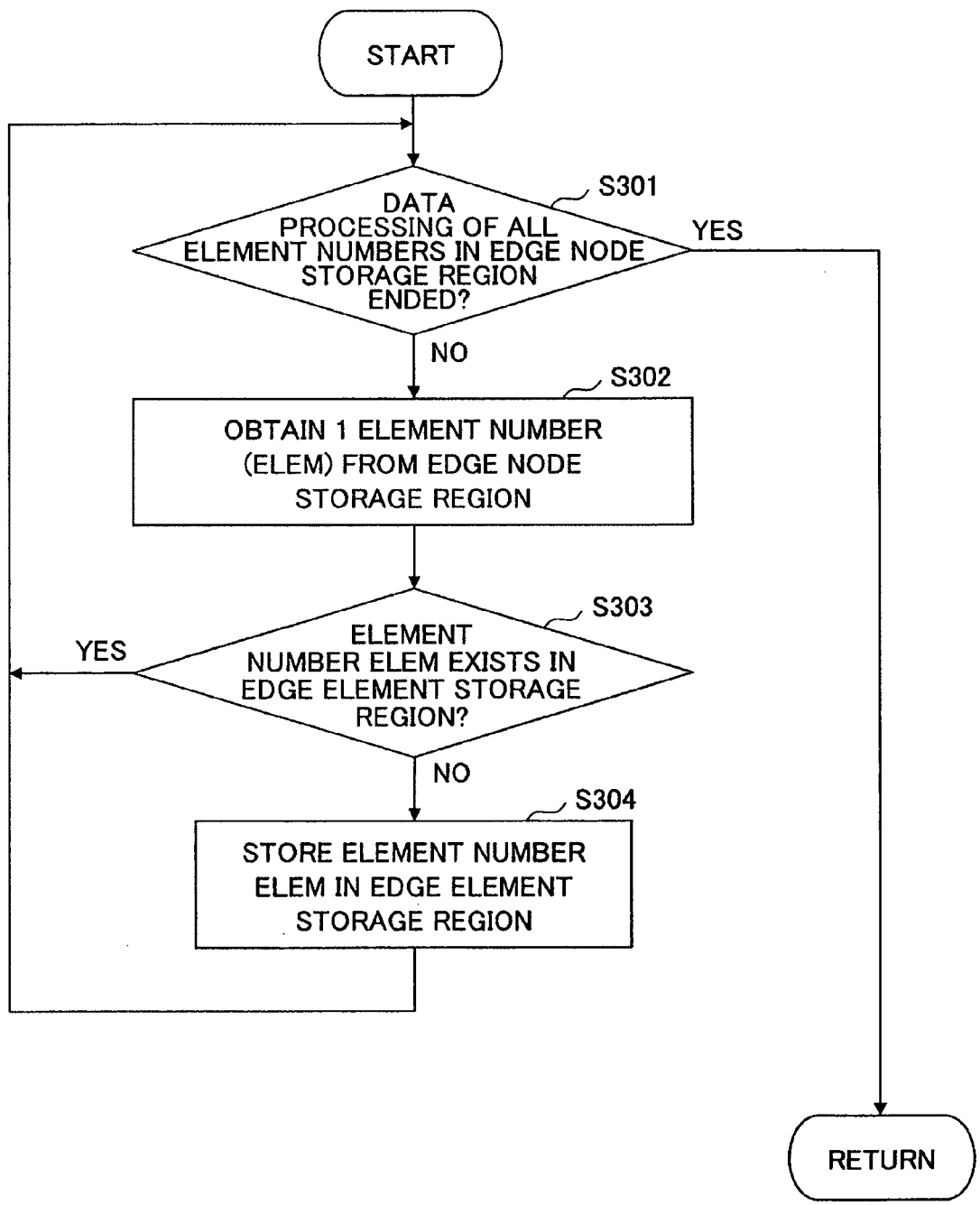
FIG. 14 is a flow chart for explaining an edge element grouping process.

FIG. 14 is a flow chart for explaining the edge element grouping process of the step S3. In FIG. 14, a step S301 decides whether or not the processing of all data stored in the edge node storage region MEM4 illustrated in FIG. 13 has ended. If the decision result in the step S301 is NO, a step S302 obtains one element number ELEM stored in the edge node storage region MEM4. A step S303 decides whether or not the element number ELEM obtained in the step S302 is stored in an edge element storage region MEM5 illustrated in FIG. 15, and the process returns to the step S301 if the decision result in the step S303 is YES. FIG. 15 is a diagram for explaining the edge element storage region MEM5. The edge element storage region MEM5 is provided in the internal storage part, for example, and stores the element number ELEM of the element which becomes the edge element with respect to each of the glass element group numbers EGx1, ..., EGxn. If the decision result in the step S303 is NO, a step S304 stores the element number ELEM which is obtained in the step S302 and is not stored in the edge element storage region MEM5, in the edge element storage region MEM5, and the process returns to the step S301. In addition, if the decision result in the step S301 is YES, the process ends and advances to the step S4 illustrated in FIG. 5. Accordingly, it is possible to automatically group the glass elements, which belong to the nodes grouped in the step S2, as the edge elements.

Figure 16:
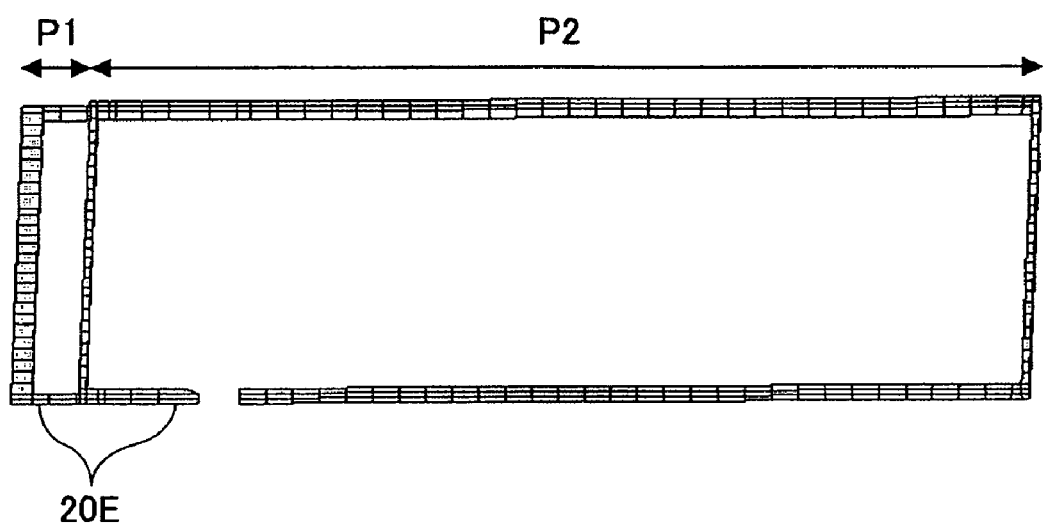
FIG. 16 is a plan view illustrating edge elements which are extracted and grouped by the edge element grouping process.

FIG. 16 is a plan view illustrating edge elements 20E which are extracted and grouped by the edge element grouping process illustrated in FIG. 14.

Figure 17:
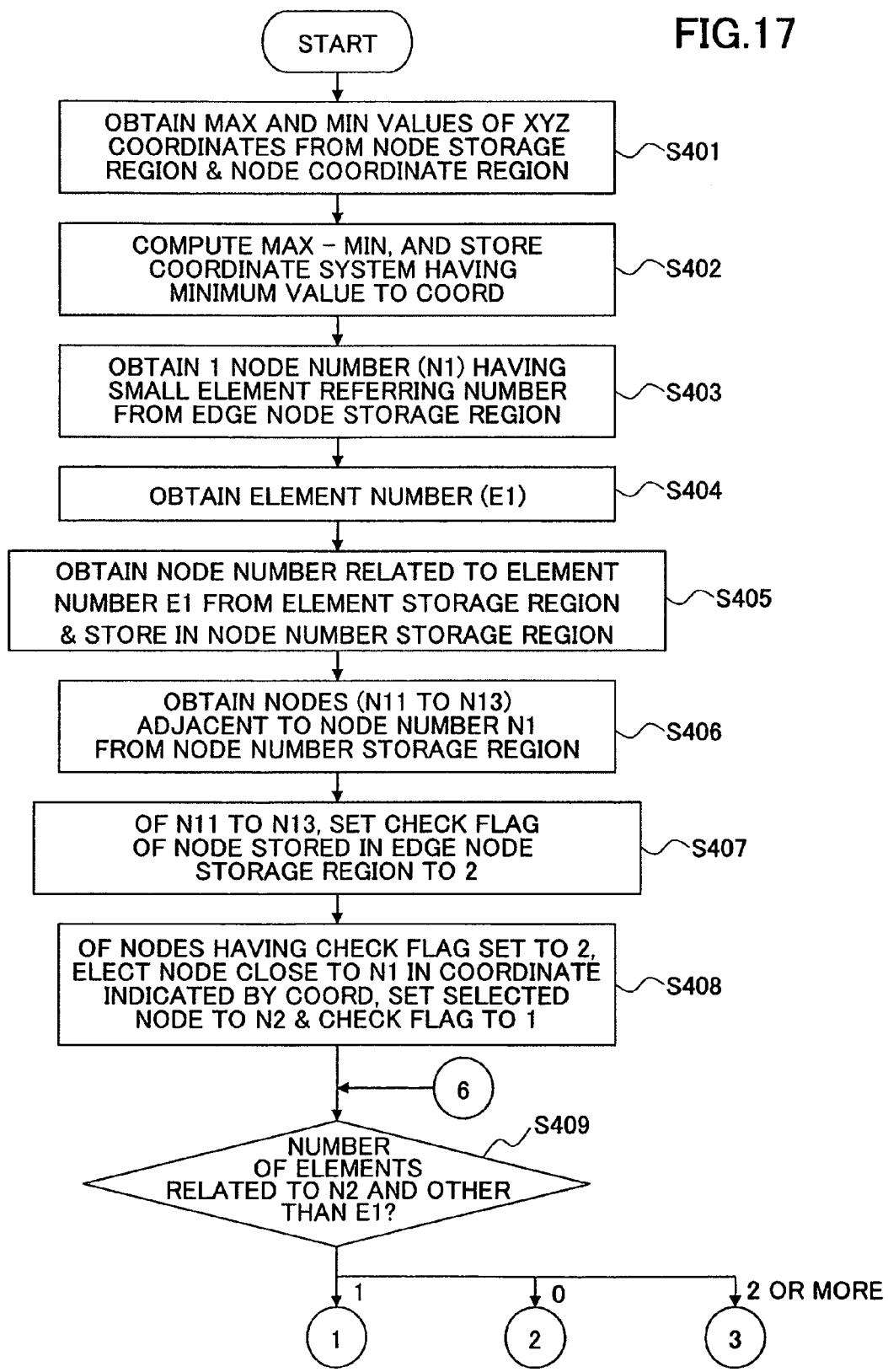
FIG. 17 is a flow chart for explaining an edge element grouping check process.
Figure 18:
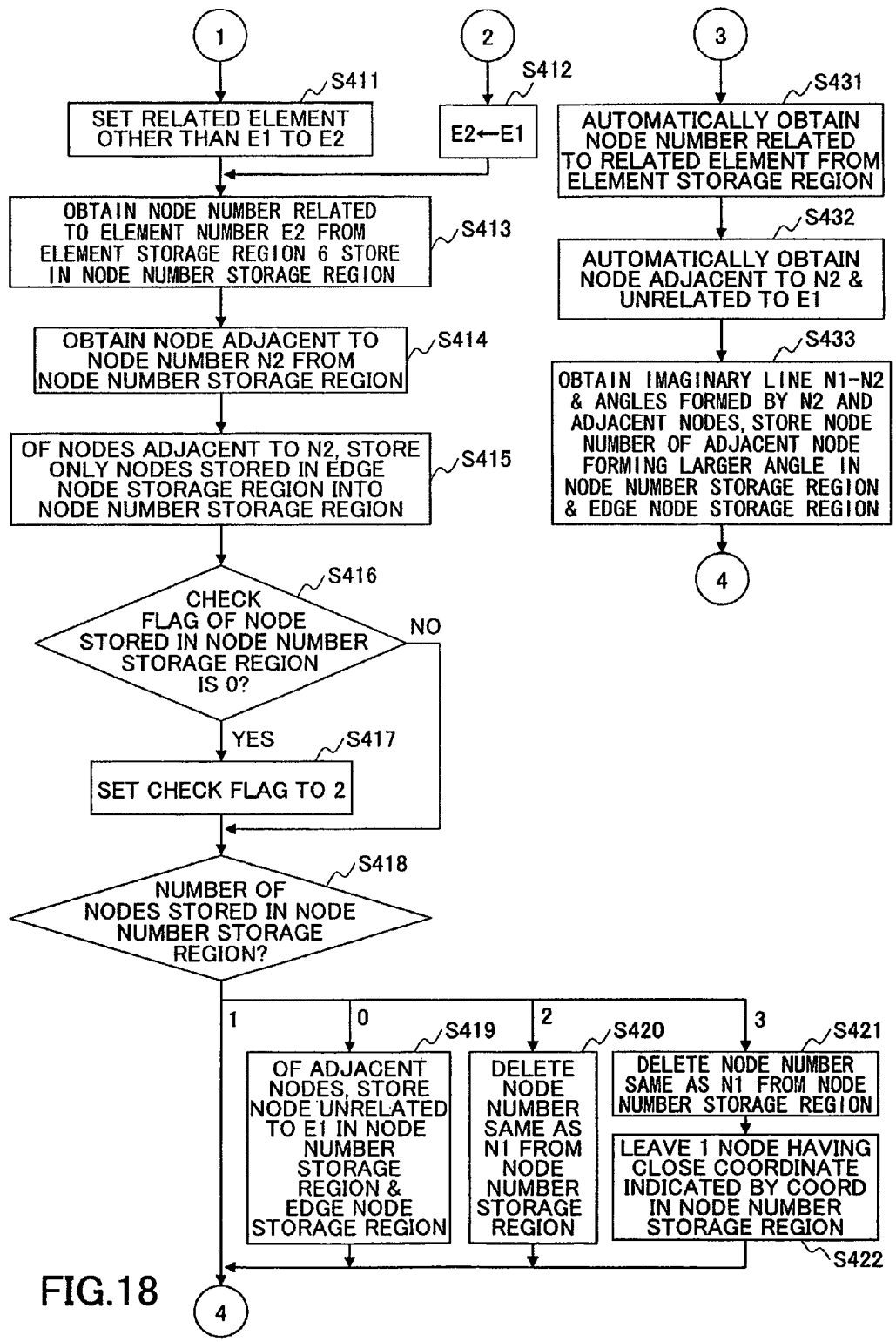
FIG. 18 is a flow chart for explaining the edge element grouping check process.
Figure 19:
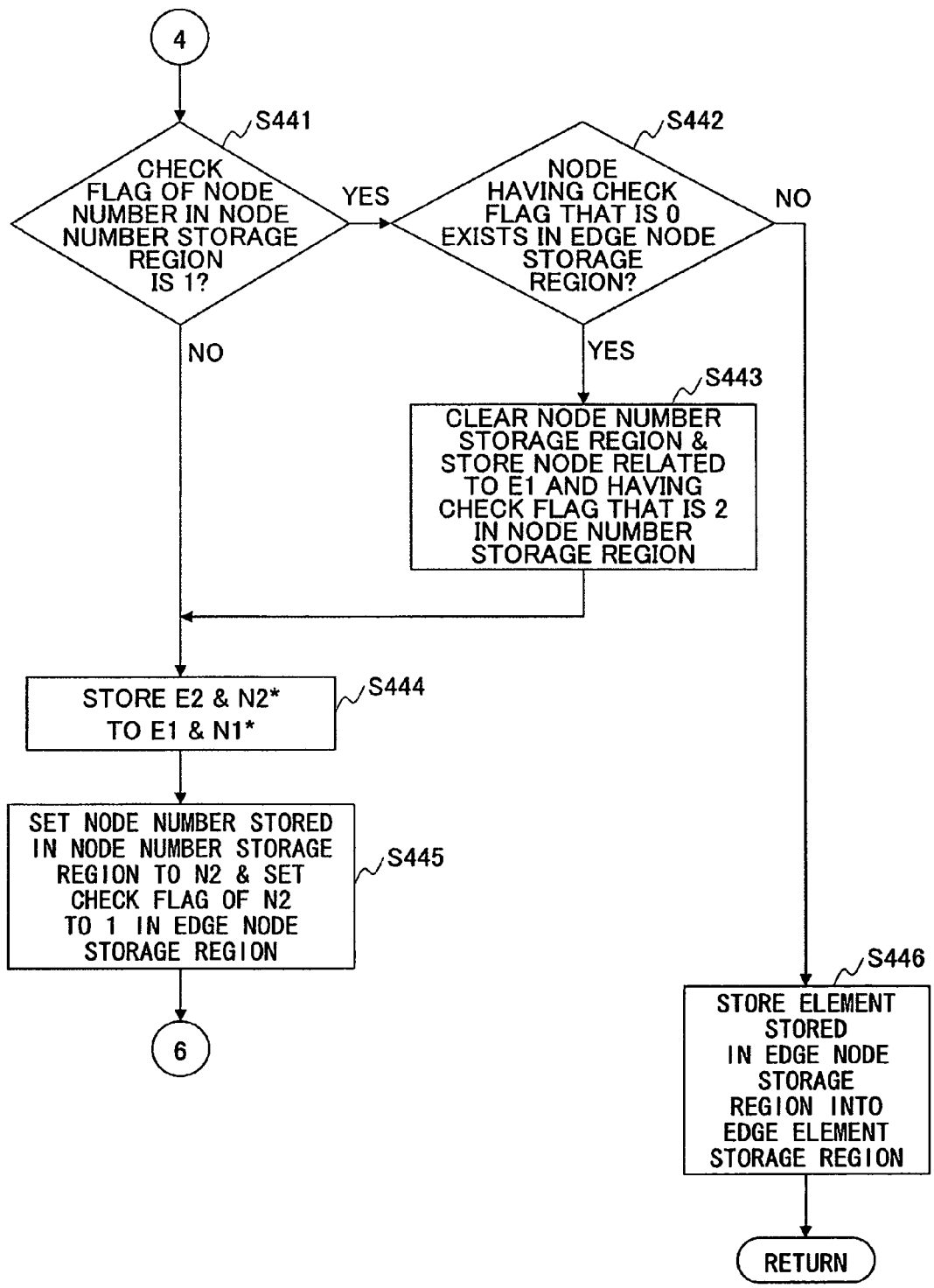
FIG. 19 is a flow chart for explaining the edge element grouping check process.
Figures 20, 21:
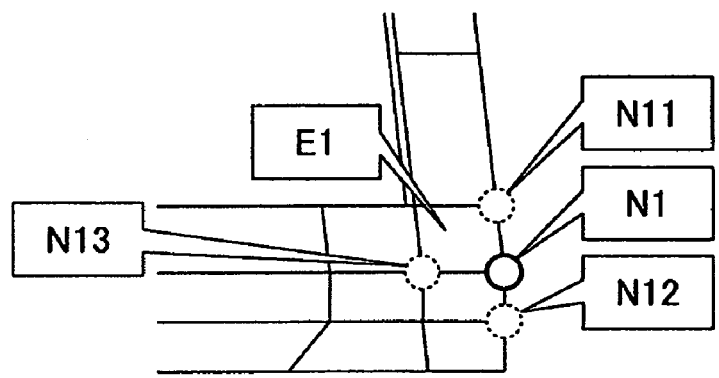
FIG. 20 is a diagram for explaining a node coordinate storage region.
FIG. 21 is a diagram for explaining an edge element checking.

FIGS. 17 through 19 are flow charts for explaining the edge element grouping check process of the step S4. In FIG. 17, a step S401 obtains a coordinate range of the glass element group number EG based on the data stored in the node storage region MEM3 illustrated in FIG. 12 and the data stored in a node coordinate storage region MEM6 illustrated in FIG. 20. FIG. 20 is a diagram for explaining the node coordinate storage region MEM6. More particularly, the step S401 obtains the minimum value and the maximum value of each of the X, Y and Z coordinates, from the data stored in the node storage region MEM3 and the node coordinate storage region MEM6. The node coordinate storage region MEM6 is provided in the internal storage part, for example, and stores the coordinate values of the X, Y and Z coordinates of each of the node numbers NODEz1, ..., NODEzp. A step S402 obtains a coordinate system for which a result of subtracting the minimum value from the maximum value in the range of each of the X, Y and Z coordinates becomes a minimum, and stores the coordinate system having the minimum subtraction result in a coordinate system storage region MEM7. The coordinate system storage region MEM7 is provided in the internal storage part, for example, and stores the coordinate system having the minimum subtraction result as a coordinate system COORD. In this example, the thickness of the display panel 2 is the minimum, and thus, the subtraction result becomes the minimum for the Z coordinate system. This Z coordinate system is stored as the coordinate system COORD in the coordinate system storage region MEM7.

Figures 22, 23:
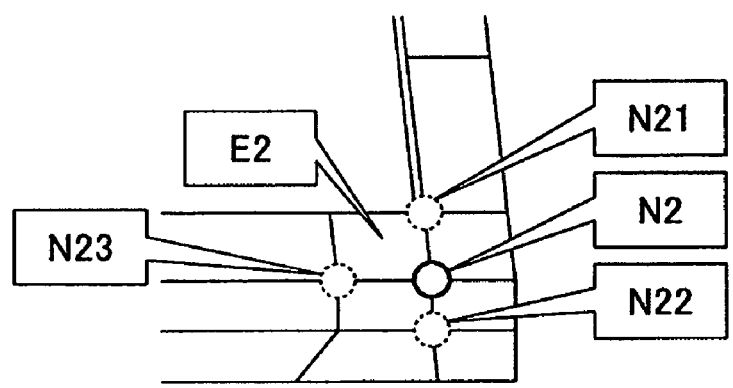
FIG. 22 is a diagram for explaining a node number storage region.
FIG. 23 is a diagram for explaining the edge element checking.

A step S403 obtains one node number N1 illustrated in FIG. 21, for example, having a small element referring number, of the glass element group EG, from the edge node storage region MEM4. A step S404 obtains a related element number E1 illustrated in FIG. 21, which is related to this node number N1, from the edge node storage region MEM4. FIG. 21 is a diagram for explaining an edge element checking. A step S405 obtains the node number NODE related to the element number E1, from the element storage region MEM2, and stores the node number NODE in a node number storage region MEM8 illustrated in FIG. 22. FIG. 22 is a diagram for explaining the node number storage region MEM8. The node number storage region MEM8 is provided in the internal storage part, for example, and stores the node number NODE obtained in the step S404. A step S406 obtains adjacent node numbers N11 through N13 which are adjacent to the node number N1, from the node number storage region MEM8.

If the node having any one of the node numbers N11 through N13 is stored in the edge node storage region MEM4, a step S407 changes the check flag CF of this node stored in the edge node storage region MEM4 to "2". As a result, in FIG. 21, the check flag CF of the node having each of the node numbers N11 through N13 is changed to "2". A step S408 selects the node having the coordinate which is indicated by the coordinate system COORD closest to the node number N1, from the nodes having the check flag CF changed to "2", regards the selected node as having a node number N2 as illustrated in FIG. 23, and sets the check flag CF of the node having the node number N2 to "1". FIG. 23 is a diagram for explaining the edge element checking. In this example, the Z coordinates of the node numbers N1, N11 and N13 in FIG. 21 are the same, and the node number N13 is selected. Node numbers N21 through N23 adjacent to the node number N2 in FIG. 23 may be obtained in a manner similar to the node numbers N11 through N11 adjacent to the node number N1 in FIG. 21.

Figure 24:
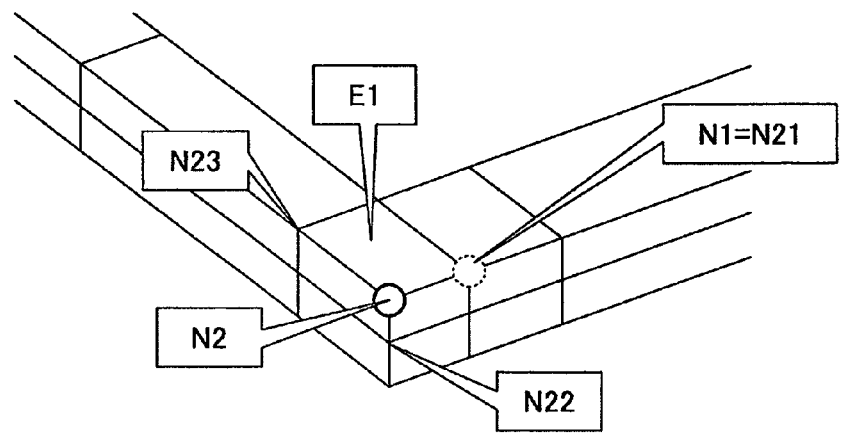
FIG. 24 is a diagram for explaining a case where no related element other than a predetermined element exists.
Figure 25:
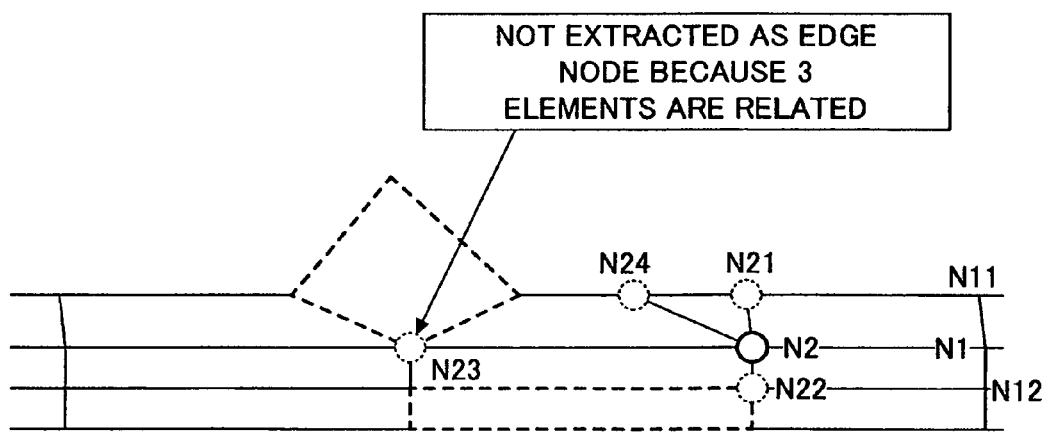
FIG. 25 is a diagram for explaining a case where a plurality of related elements other than the predetermined element exist.

A step S409 judges the number of elements which are related to the node number N2 and are other than the element having the element number E1. Depending on the number of elements obtained as a result of the judgement in the step S409, the process advances to a step S411 illustrated in FIG. 18 or, to a step S412 illustrated in FIG. 18 or, to a step S431 illustrated in FIG. 18. In other words, the process advances to the step S411 if the number of elements which are related to the node number N2 and are other than the element having the element number E1 is 1, advances to the step S412 if the number of elements is 0, and advances to the step S431 if the number of elements is 2 or more as illustrated in FIG. 25. FIG. 24 is a diagram for explaining a case where no related element other than a predetermined element (E1) exists. FIG. 25 is a diagram for explaining a case where a plurality of related elements other than the predetermined element (E1) exist.

In FIG. 18, the step S411 regards the element number of the related element which is other than the element having the element number E1, as having an element number E2, and the process advances to a step S413 which will be described later. In addition, the step S412 regards the element having the element number E1 as having the element number E2, and the process advances to the step S413 which will be described later.

The step S431 obtains the node numbers of the related elements other than the element having the element number E1, from the element storage region MEM2. A step S432 obtains from the nodes having the node numbers obtained in the step S431 the nodes which are adjacent to the node having the node number N2 and is not related to the element number E1. In the case illustrated in FIG. 25, the step S432 obtains the nodes having the node numbers N23 and N24. A step S433 obtains an imaginary line N1-N2 connecting the nodes having the node numbers N1 and N2, and the angles formed by the node having the node number N2 and the adjacent nodes, such as the nodes having the node numbers N23 and N24, which is adjacent to the node having the node number N2. The step S433 stores the node number of the adjacent node which forms the larger angle with the node having the node number N2, in the node number storage region MEM8 and the edge node storage region MEM4. After the step S433, the process advances to a step S441 which will be described later in conjunction with FIG. 19.

The step S413 obtains the node number of the node related to the element number E2 from the element storage region MEM2, and stores the obtained node number in the node number storage region MEM8. A step S414 obtains the adjacent node numbers which are adjacent to the node number N2 from the node number storage region MEM8. Of the adjacent node numbers obtained, a step S415 stores only the node number which is stored in the edge node storage region MEM4, in the node number storage region MEM8. A step S416 decides whether or not the check flag CF of the node stored in the node number storage region MEM8 is "0". If the decision result in the step S416 is YES, a step S417 sets the check flag CF to "2". If the decision result in the step S416 is NO or, after the step S417, a step S418 judges the number of nodes stored in the node number storage region MEM8. More particularly, the step S418 judges whether the number of nodes stored in the node number storage region MEM8 is 1, 0, 2 or 3.

If the number of nodes is 1 as a result of the judgement made in the step S418, the process advances to the step S441 which will be described later in conjunction with FIG. 19.

Figure 26:
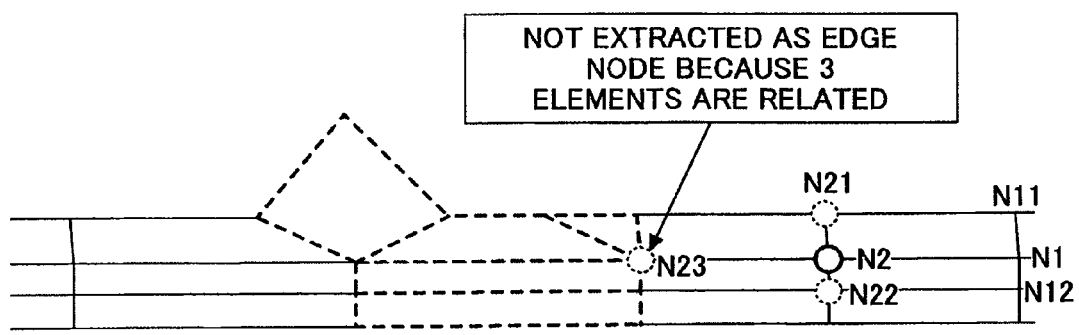
FIG. 26 is a diagram for explaining addition of edge nodes and elements.

If the number of nodes is 0 as a result of the judgement made in the step S418, as illustrated in FIG. 26, a step S419 stores, of the adjacent nodes, the node which is not related to the element number E1, in the node number storage region MEM8 and the edge node storage region MEM4. After the step S419, the process advances to the step S441 which will be described later in conjunction with FIG. 19. FIG. 26 is a diagram for explaining the addition of the nodes of the edge elements, that is, the edge nodes and the elements.

Figure 27:
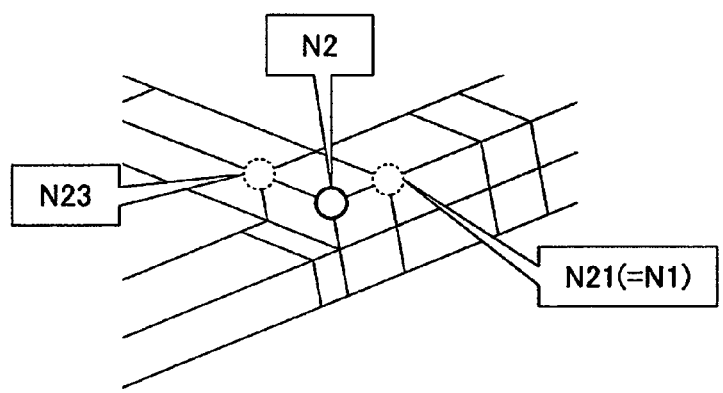
FIG. 27 is a diagram for explaining a case where 2 edge nodes exist in a node number storage region.

If the number of nodes is 2 as a result of the judgement made in the step S418, as illustrated in FIG. 27, a step S420 deletes from the node number storage region MEM8 the node number identical to the node number N1. After the step S420, the process advances to the step S441 which will be described later in conjunction with FIG. 19. FIG. 27 is a diagram for explaining a case where 2 edge nodes exist in the node number storage region MEM8.

If the number of nodes is 3 as a result of the judgement made in the step S418, as illustrated in FIG. 24, a step S421 deletes from the node number storage region MEM8 the node number identical to the node number N1. In addition, a step S422 leaves one node having the coordinate which is indicated by the coordinate system COORD closest to the node number N1 stored in the node number storage region MEM8, and the process advances to the step S441 which will be described later in conjunction with FIG. 19.

In FIG. 19, the step S441 obtains the check flag CF of the node number in the node number storage region MEM8 from the edge node storage region MEM4, and decides whether or not the check flag CF is "1". If the decision result in the step S441 is NO, the process advances to a step S444 which will be described later. If the decision result in the step S441 is YES, a step S442 decides whether or not the edge node storage region MEM4 stores a node having the check flag CF which is "0". If the decision result in the step S442 is YES, a step S443 clears the node number storage region MEM8, and obtains the node which is related to the element number E2 and has the check flag CF which is "2" from the edge node storage region MEM4. The step S443 stores the node which is obtained in the node number storage region MEM8, and the process advances to the step S444. On the other hand, the process advances to a step S446 if the decision result in the step S442 is NO.

The step S444 changes the element number E2 to the element number E1, and changes the node number N2 to the node number N1. A step S445 sets the node number stored in the node number storage region MEM8 to N2, and sets the check flag CF of the node number N2 stored in the edge node storage region MEM4 to "1". After the step S445, the process returns to the step S409 illustrated in FIG. 17.

The step S446 stores the elements stored in the edge node storage region MEM4 into the edge element storage region MEM5 as edge elements, so that the edge elements do not overlap. After the step S446, the process ends and advances to the step S5 illustrated in FIG. 5. Accordingly, the process of checking whether or not the glass elements in the edge portion of the display panel 2 are all grouped as the edge elements, and carrying out the grouping of the step S3 until the glass elements in the edge portion are all grouped as the edge elements, is carried out automatically. In other words, in order to prevent the elements (or meshes) which are not created regularly from being left out of the group of edge elements when grouping of the edge elements in the step S3, a judgement is made based on the information related to the edge elements and the edge nodes to determine whether or not the edge elements are continuous elements, and the edge element at the non-continuous portion is automatically added to the group of edge elements.

Figure 28:
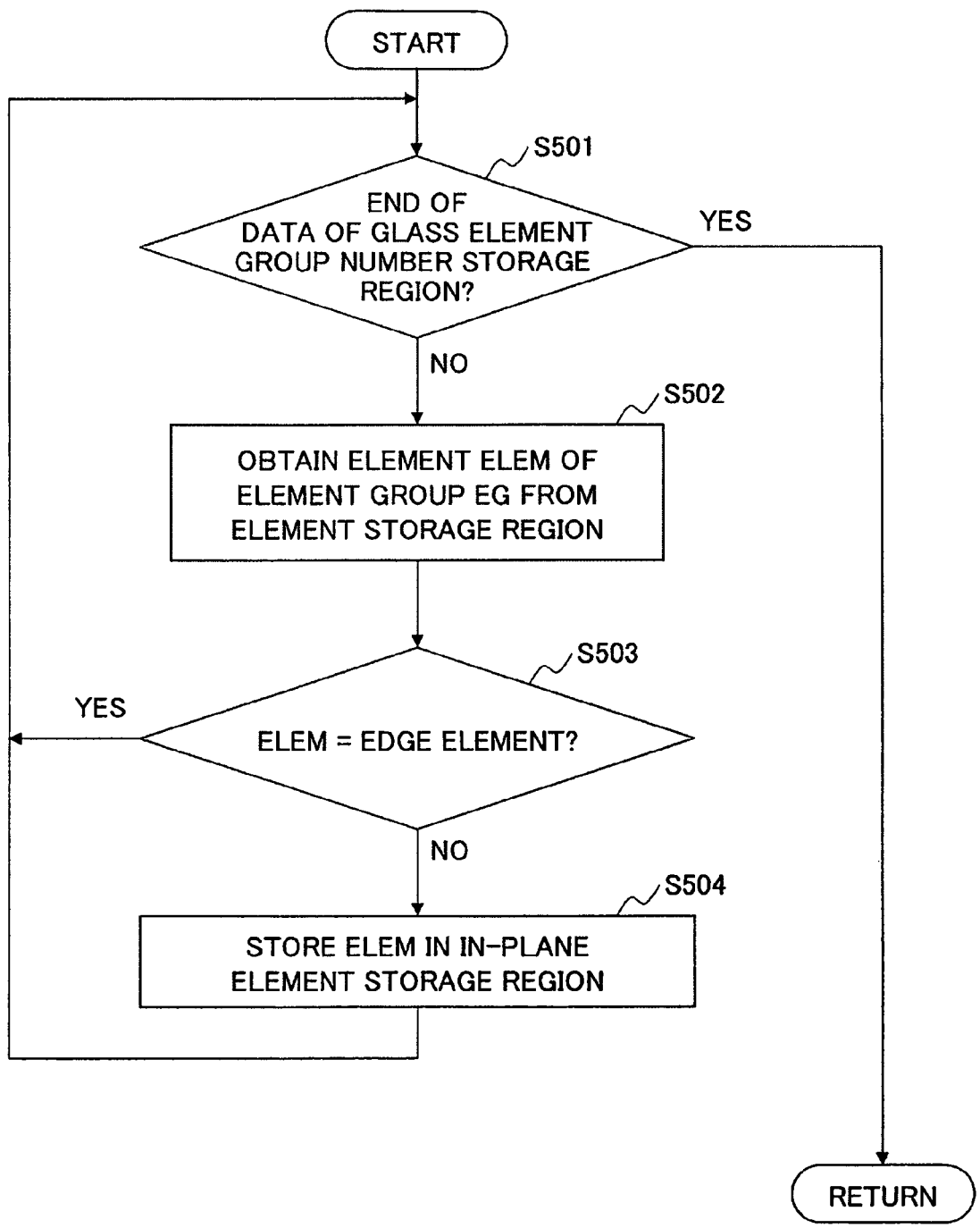
FIG. 28 is a flow chart for explaining an in-plane element grouping process.

FIG. 28 is a flow chart for explaining the in-plane element grouping process of the step S5. In FIG. 28, a step 501 decides whether or not the processing of all of the data in the glass element group number storage region MEM1 has ended. If the decision result in the step S501 is NO, a step S502 obtains from the element storage region MEM2 the element number ELEM of the element group EG which is stored in the glass element group number storage region MEM1 and has not yet been processed. A step S503 decides whether or not the element having the element number ELEM is an edge element, and the process returns to the step S501 if the decision result in the step S503 is YES. If the decision result in the step S503 is NO, a step S504 stores the element number ELEM in an in-plane element storage region MEM9 illustrated in FIG. 29, as an in-plane element, and the process returns to the step S501. FIG. 29 is a diagram for explaining the in-plane element storage region MEM9. The in-plane element storage region MEM9 is provided in the internal storage part, for example, and stores the element number ELEM of each of the glass element group numbers EGIDx1, . . . , EGIDxn. The process ends if the decision result in the step S501 is YES. Accordingly, the glass elements which are other than the edge elements grouped in the steps S3 and S4 are automatically grouped as the in-plane elements.

According to the embodiment described above, even if the analyzing element (or part size or element size) changes, it is possible to automatically group the elements forming the analyzing model into the edge elements and the in-plane elements, and the processing efficiency can be improved. In addition, because the elements forming the analyzing model are automatically grouped into the edge elements and the in-plane elements, there is no possibility of the user making an erroneous operation or an erroneous judgement, and the load on the user can be reduced. For example, the edge elements and the in-plane elements which are grouped may be used for various tests and evaluations of the analyzing model, such as evaluating the distortion when judging the break in the element which is formed by a breakable material such as glass. A description related to the procedure itself of the various tests and evaluations of the analyzing model will be omitted, because known procedures may be employed therefor. Such known procedures may be realized by the computer system 100, and the edge elements and the in-plane elements which are grouped and stored in the internal storage part, for example, are automatically obtained by the computer system 100 when carrying out the test or evaluation.

Figure 30:
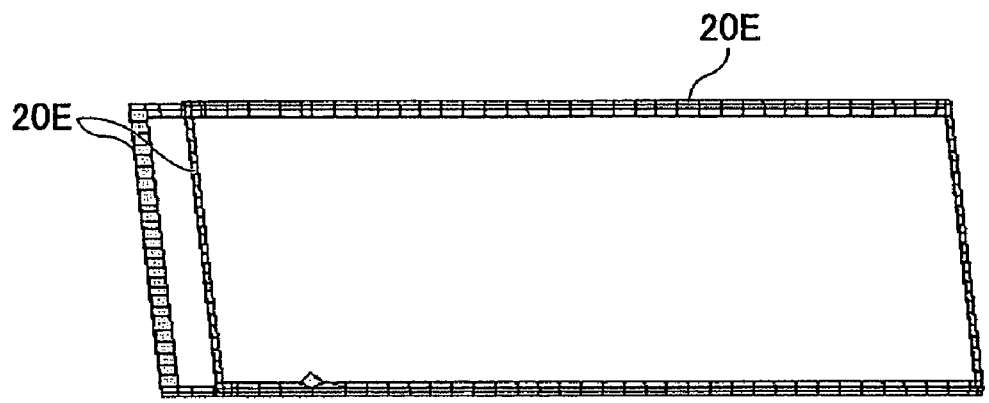
FIG. 30 is a diagram illustrating edge elements.
Figure 31:
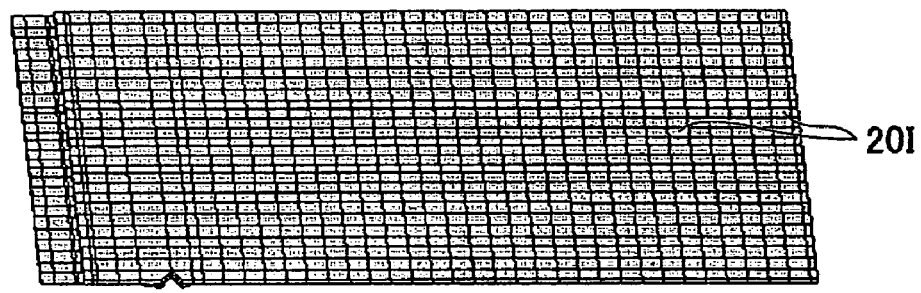
FIG. 31 is a diagram illustrating in-plane elements.

FIG. 30 is a diagram illustrating the edge elements 20E which are automatically grouped by the grouping process of FIG. 5. FIG. 31 is a diagram illustrating in-plane elements 20I which are automatically grouped by the grouping process of FIG. 5. The edge elements 20E and the in-plane elements 20I illustrated in FIGS. 30 and 31 are displayed on the display screen 102a of the display 102 when carrying out the grouping by the steps S2 through S4.

Figure 32:
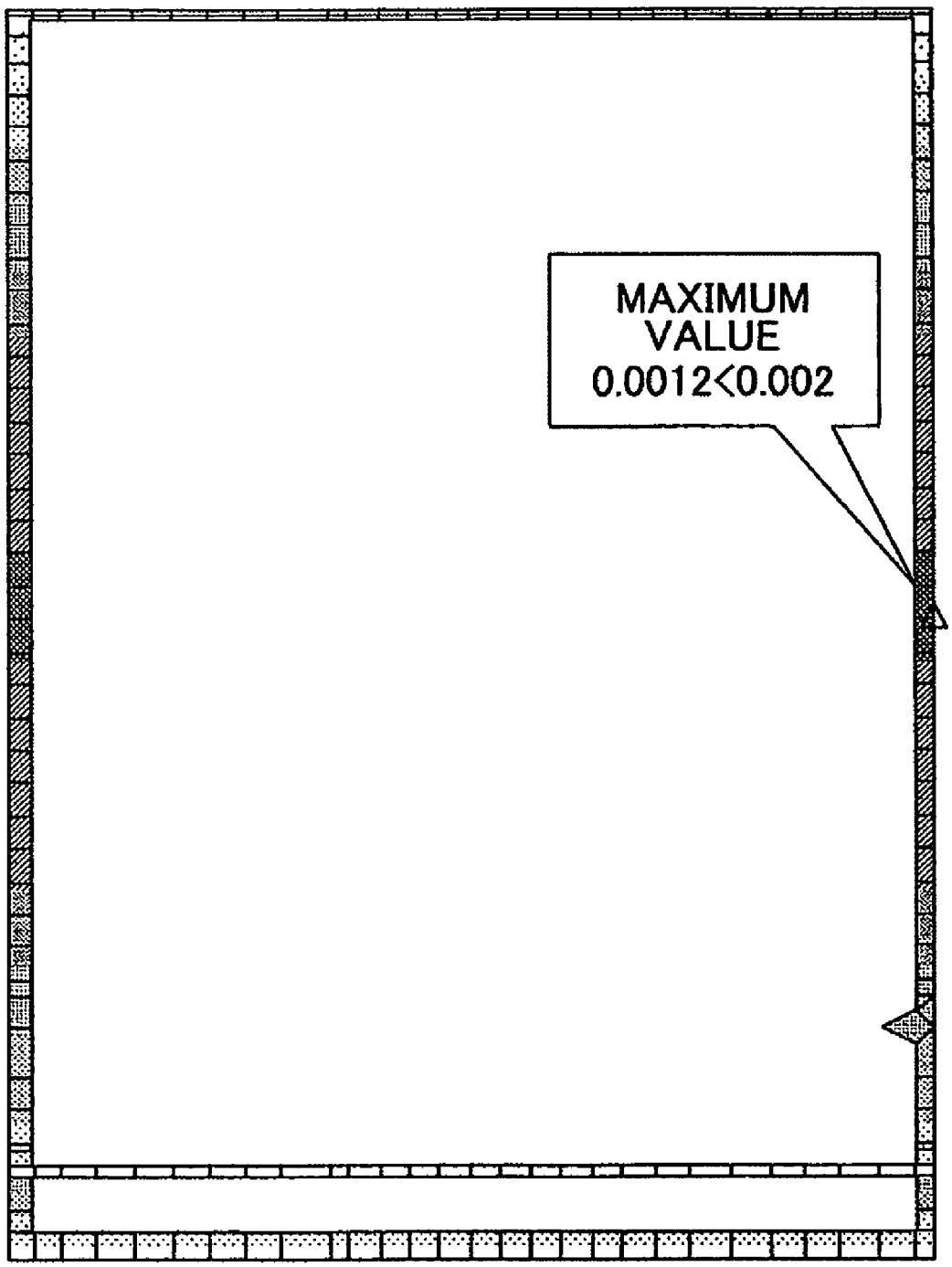
FIG. 32 is a diagram illustrating evaluation results of distortions of the edge elements.
Figure 33:
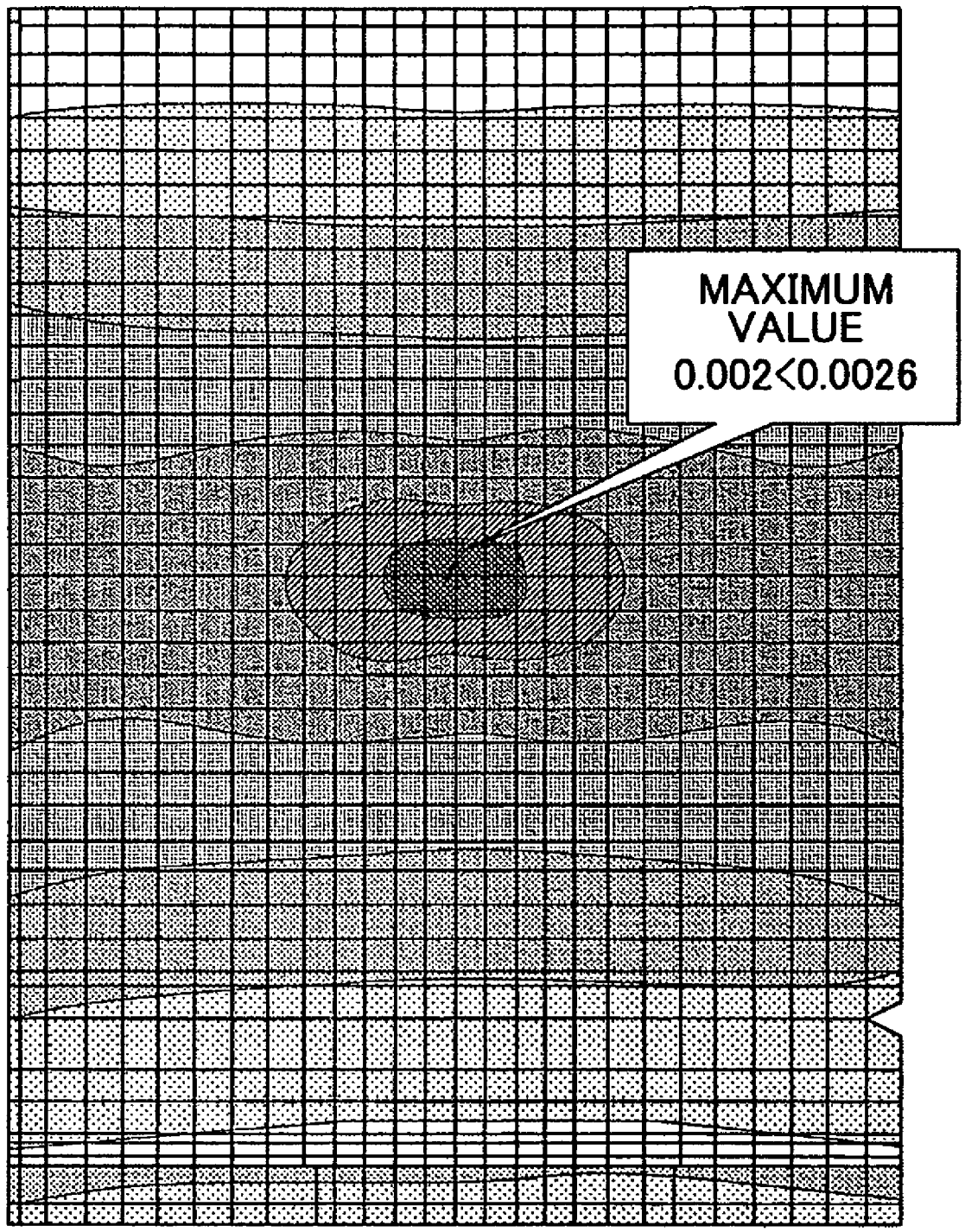
FIG. 33 is a diagram illustrating evaluation results of distortion distributions of the in-plane elements.

FIG. 32 is a diagram illustrating evaluation results of distortions of the edge elements 20E illustrated in FIG. 30. FIG. 33 is a diagram illustrating evaluation results of distortion distributions of the in-plane elements 20I illustrated in FIG. 31. FIGS. 32 and 33 illustrate the simulation results for a case where the display panel 2 is formed by a Liquid Crystal Display (LCD) panel, the distortion threshold value of the edge portions of the LCD panel formed by the edge elements 20E is 0.0002, and the distortion threshold value of the portions other than the edge portions of the LCD panel formed by the in-plane elements 20I is 0.0026, where the darker color of the distortion distribution indicates larger distortions. In this case, a maximum value of the distortion at the edge portion formed by the edge elements 20E becomes 0.0012 at the position indicated in FIG. 32, and because 0.0012<0.002, it was confirmed that no break occurs even at the position where the distortion takes the maximum value. In addition, a maximum value of the distortion at the portion other than the edge portion and formed by the in-plane elements 20I becomes 0.002 at the position indicated in FIG. 33, and because 0.002<0.0026, it was confirmed that no break occurs even at the position where the distortion takes the maximum value. Accordingly, the edge elements 20E and the in-plane elements 20I which are automatically grouped by the grouping process of FIG. 5 accurately correspond to the edge portion and the portion other than the edge portion of the analyzing mode, respectively, and it was confirmed that the edge elements 20E and the in-plane elements 20I which are grouped are suited for use in simulations such as when evaluating the distortion.

This application claims the benefit of a Japanese Patent Application No. 2007-296840 filed Nov. 15, 2007, in the Japanese Patent Office, the disclosure of which is hereby incorporated by reference.

Further, the present invention is not limited to these embodiments, but various variations and modifications may be made without departing from the scope of the present invention.

What is claimed is:

1. An element grouping method for Finite Element Method (FEM) analysis, to be implemented in a computer, comprising:

a node grouping step grouping, by the computer, nodes of specific elements having a common parameter that relates to a material forming the elements amongst elements forming an analyzing model which is to be analyzed, and storing in a storage part, by the computer, grouped nodes having a referring number which is a predetermined value or less together with the specific elements to which the grouped nodes belong, said referring number indicating a number of times a reference is made to each of the grouped nodes;

an edge element grouping step grouping, by the computer, the specific elements to which the grouped nodes belong from the storage part, and storing in the storage part, by the computer, the grouped specific elements that are defined as edge elements;

a grouping check step checking, by the computer, whether all specific elements in an edge portion of the analyzing model are grouped as the edge elements, and executing said edge element grouping step by the computer until all specific elements in the edge portion are grouped as the edge elements; and an in-plane element grouping step grouping and storing in the storage part, by the computer, specific elements, other than the specific elements in the edge portion which are grouped as the edge elements, as the in-plane elements, wherein the grouping check step judges, by the computer, whether the edge elements in a portion of the analyzing model are continuous based on information of the edge elements and edge nodes belonging to the edge elements, and adds to the grouped edge elements and stores in the storage part, by the computer, the edge elements in a non-continuous portion of the analyzing model where the edge elements are not continuous.

2. The element grouping method as claimed in claim 1, further comprising:

a specific element extracting step extracting, by the computer, the specific elements from the analyzing model based on the common parameter, and storing, by the computer, the specific elements which are extracted in the storage part.

3. The element grouping method as claimed in claim 2, wherein the edge elements and the in-plane elements are obtained from the storage part by the computer when testing or evaluating the analyzing model to judge a break of a part which is segmented into elements.

4. The element grouping method as claimed in claim 3, wherein the material is selected from a group of breakable materials consisting of glass, plastic and ceramic.

5. The element grouping method as claimed in claim 1, wherein the predetermined value is two.

6. The element grouping method as claimed in claim 1, further comprising:

a step displaying on a display, by the computer, the edge elements and the in-plane elements which have been grouped.

7. The element grouping method as claimed in claim 1, wherein the grouping check step performs the checking based on an arbitrary node obtained from the grouped nodes, nodes adjacent to the arbitrary node, and a number of specific elements to which the arbitrary node belongs, by referring to information stored in the storage part.

8. A non-transitory computer-readable storage medium which stores a program for causing a computer to perform an element grouping process for Finite Element Method (FEM) analysis, said element grouping process comprising:

a node grouping procedure causing the computer to group nodes of specific elements having a common parameter that relates to a material forming the elements amongst elements forming an analyzing model which is to be analyzed, and to store in a storage part grouped nodes having a referring number which is a predetermined value or less together with the specific elements to which the grouped nodes belong, said referring number indicating a number of times a reference is made to each of the grouped nodes;

an edge element grouping procedure causing the computer to group the specific elements to which the grouped nodes belong from the storage part, and to store in the storage part the grouped specific elements that are defined as edge elements;

a grouping check procedure causing the computer to check whether all specific elements in an edge portion of the analyzing model are grouped as the edge elements, and to execute said edge element grouping procedure until all specific elements in the edge portion are grouped as the edge elements; and an in-plane element grouping procedure causing the computer to group and store in the storage part specific elements, other than the specific elements in the edge portion which are grouped as the edge elements, as the in-plane elements, wherein the grouping check procedure causes the computer to judge whether the edge elements in a portion of the analyzing model are continuous based on information of the edge elements and edge nodes belonging to the edge elements, and to add to the grouped edge elements and store in the storage part the edge elements in a non-continuous portion of the analyzing model where the edge elements are not continuous.

9. The computer-readable storage medium as claimed in claim 8, wherein said element grouping process further comprises:

a specific element extracting procedure causing the computer to extract the specific elements from the analyzing model based on the common parameter, and to store the specific elements which are extracted in the storage part.

10. The computer-readable storage medium as claimed in claim 9, wherein said element grouping process obtains the edge elements and the in-plane elements from the storage part when testing or evaluating the analyzing model to judge a break of a part which is segmented into elements.

11. The computer-readable storage medium as claimed in claim 10, wherein the material is selected from a group of breakable materials consisting of glass, plastic and ceramic.

12. The computer-readable storage medium as claimed in claim 8, wherein the predetermined value is two.

13. The computer-readable storage medium as claimed in claim 8, wherein said element grouping process further comprises:

a procedure causing the computer to display on a display the edge elements and the in-plane elements which have been grouped.

14. The computer-readable storage medium as claimed in claim 8, wherein the grouping check procedure performs the checking based on an arbitrary node obtained from the grouped nodes, nodes adjacent to the arbitrary node, and a number of specific elements to which the arbitrary node belongs, by referring to information stored in the storage part.

* * * * *